US012581676B2

(12) United States Patent
Kuo et al.

(10) Patent No.: US 12,581,676 B2
(45) Date of Patent: Mar. 17, 2026

(54) GRAPHENE ALL AROUND INTERCONNECT AND MANUFACTURING METHOD THEREOF

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Chi-Yuan Kuo, New Taipei (TW); I-Chih Ni, New Taipei (TW); Fang-Yu Fu, New Taipei (TW); Chih-I Wu, Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 372 days.

(21) Appl. No.: 18/312,124

(22) Filed: May 4, 2023

(65) Prior Publication Data

US 2024/0371965 A1 Nov. 7, 2024

(51) Int. Cl.
| | |
|---|---|
| *H10D 30/01* | (2025.01) |
| *H01L 21/324* | (2006.01) |
| *H01L 21/677* | (2006.01) |
| *H10D 62/80* | (2025.01) |
| *H10D 62/83* | (2025.01) |
| *H10D 64/23* | (2025.01) |
| *H10D 84/01* | (2025.01) |

(Continued)

(52) U.S. Cl.
CPC .......... *H10D 30/01* (2025.01); *H01L 21/324* (2013.01); *H01L 21/67781* (2013.01); *H10D 62/8303* (2025.01); *H10D 62/882* (2025.01);

*H10D 64/251* (2025.01); *H10D 84/017* (2025.01); *H10D 84/038* (2025.01); *H10D 84/85* (2025.01)

(58) Field of Classification Search
CPC .... H10D 30/01; H10D 62/8303; H10D 62/82; H10D 84/85; H10D 64/251; H10D 84/017; H10D 84/038; H01L 21/324; H01L 21/67781
USPC ........................................................ 257/288
See application file for complete search history.

(56) References Cited

U.S. PATENT DOCUMENTS

| | | | | |
|---|---|---|---|---|
| 9,929,257 B2 * | 3/2018 | Colinge | ................. | H10D 30/63 |
| 2017/0222056 A1 * | 8/2017 | Sawai | .................... | H10D 88/00 |
| 2019/0096801 A1 * | 3/2019 | Yang | ................... | H01L 23/5226 |

(Continued)

FOREIGN PATENT DOCUMENTS

| | | | | |
|---|---|---|---|---|
| KR | 20220013544 A | * | 2/2022 | ............. H01G 11/64 |

OTHER PUBLICATIONS

Baek et al., "Transfer-free growth of polymer-derived graphene on dielectric substrate from mobile hot-wire-assisted dual heating system", Carbon 127, 2018, pp. 41-46.

(Continued)

*Primary Examiner* — Phuc T Dang
(74) *Attorney, Agent, or Firm* — Birch, Stewart, Kolasch & Birch, LLP

(57) ABSTRACT

A method includes loading a wafer having a catalytic metal thereon into a processing chamber, introducing a hydrocarbon precursor into the processing chamber, pyrolyzing the hydrocarbon precursor; conducting the pyrolyzed hydrocarbon precursor to the catalytic metal to form a graphene layer on the catalytic metal at a temperature lower than about 400° C.

20 Claims, 26 Drawing Sheets

(51) Int. Cl.
　　*H10D 84/03*　　　(2025.01)
　　*H10D 84/85*　　　(2025.01)

(56)　　　　　　　References Cited

U.S. PATENT DOCUMENTS

2022/0048773  A1 *　2/2022　Song ................. H01L 21/02527
2022/0102344  A1 *　3/2022　Then .................... H10D 62/119

OTHER PUBLICATIONS

Chen et al., "Effects of acetylene flow rate and processing temperature on graphene films grown by thermal chemical vapor deposition", Thin Solid Films 584, 2015, pp. 265-269.

Hafiz et al., "Fabrication of high-quality graphene by hot-filament thermal chemical vapor deposition", Carbon 86, 2015, pp. 1-11.

Hawaldar et al., "Large-area high-throughput synthesis of monolayer graphene sheet by Hot Filament Thermal Chemical Vapor Deposition", Scientific Reports 2 : 682, 2012, pp. 1-9.

Lee et al., "Effect of nucleation density on the crystallinity of graphene grown from mobile hot-wire-assisted CVD", 2D Mater. 6, 2019, p. 1-7.

Li et al., "Evolution of Graphene Growth on Ni and Cu by Carbon Isotope Labeling", Nano Letters, American Chemical Society, 2009, vol. 9, No. 12, pp. 4268-4272.

Liu et al., "Universal Segregation Growth Approach to Wafer-Size Graphene from Non-Noble Metals", Nano Letters, American Chemical Society, 2011, pp. 297-303.

Nam et al., "Chemical vapor deposition of graphene on platinum: Growth and substrate interaction", Carbon 111, 2017, pp. 733-740.

Nang et al., "Understanding the Growth Kinetics of Graphene on Cu and $Fe_2O_3$ Using Inductively-Coupled Plasma Chemical Vapor Deposition", Applied Microscopy, Korean Society of Microscopy, 2017, pp. 13-18.

Ramón et al., "CMOS-Compatible Synthesis of Large-Area, High-Mobility Graphene by Chemical Vapor Deposition of Acetylene on Cobalt Thin Films", ACSNANO, vol. 5, No. 9, 2011, pp. 7198-7204.

Sahu et al., "Properties and Applications of Ruthenium", Noble and Precious Metals—Properties, Nanoscale Effects and Applications, Chapter 17, 2018, pp. 377-390.

Selvakumar et al., "Controlled growth of high-quality graphene using hot-filament chemical vapor deposition", Applied Physics A 122: 943, 2016, pp. 1-11.

Siller et al., "The solubility of carbon in palladium and platinum", Journal of the Less Common Metals, vol. 16, Issue 1, Sep. 1968, pp. 71-73.

Singh et al., "Growth of large $sp^2$ domain size single and multi-layer graphene films at low substrate temperature using hot filament chemical vapor deposition", Materials Letters 126, 2014, pp. 249-252.

Singh et al., "Study of the Growth of Graphene Film on Ni and Si Substrates by Hot Filament Chemical Vapor Deposition", AIP Conference Proceedings 1536, 2013, pp. 545-546.

Son et al., "Low-temperature synthesis of graphene by chemical vapor deposition and its applications", FlatChem 5, 2017, pp. 40-49.

Wang et al., "Synthesis and characterization of graphene-based nanostructures by electron-assisted hot filament plasma CVD", Diamond & Related Materials 86, 2018, pp. 179-185.

Xue et al., "Low Temperature Growth of Highly Nitrogen-Doped Single Crystal Graphene Arrays by Chemical Vapor Deposition", Journal of the American Chemical Society, 2012, 134, pp. 11060-11063.

Yang et al., "Solubility and Diffusivity of Carbon in Metals", Journal of Catalysis, Mar. 1990, vol. 122, Issue 1, pp. 206-210.

* cited by examiner

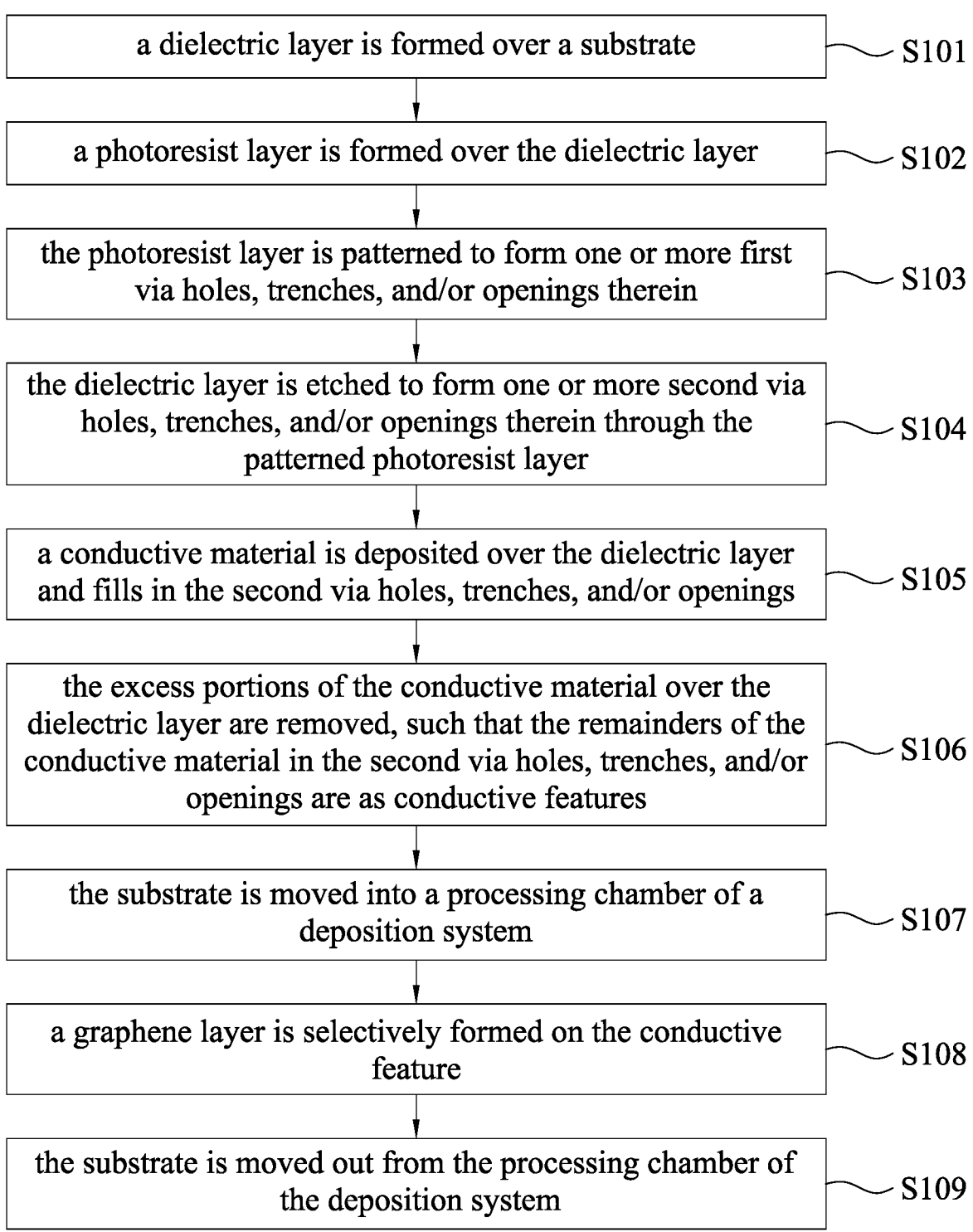

| a dielectric layer is formed over a substrate | S101 |

| a photoresist layer is formed over the dielectric layer | S102 |

| the photoresist layer is patterned to form one or more first via holes, trenches, and/or openings therein | S103 |

| the dielectric layer is etched to form one or more second via holes, trenches, and/or openings therein through the patterned photoresist layer | S104 |

| a conductive material is deposited over the dielectric layer and fills in the second via holes, trenches, and/or openings | S105 |

| the excess portions of the conductive material over the dielectric layer are removed, such that the remainders of the conductive material in the second via holes, trenches, and/or openings are as conductive features | S106 |

| the substrate is moved into a processing chamber of a deposition system | S107 |

| a graphene layer is selectively formed on the conductive feature | S108 |

| the substrate is moved out from the processing chamber of the deposition system | S109 |

Fig. 1

GRAPHENE ALL AROUND INTERCONNECT AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flowchart of a method for forming a semiconductor structure in accordance with some embodiments of the present disclosure.

FIGS. 2-5, 6A, and 7A-9A illustrate a method in various stages of forming a semiconductor structure including a graphene layer in accordance with some embodiments of the present disclosure.

DETAILED DESCRIPTION

Figures 2, 3, 4:
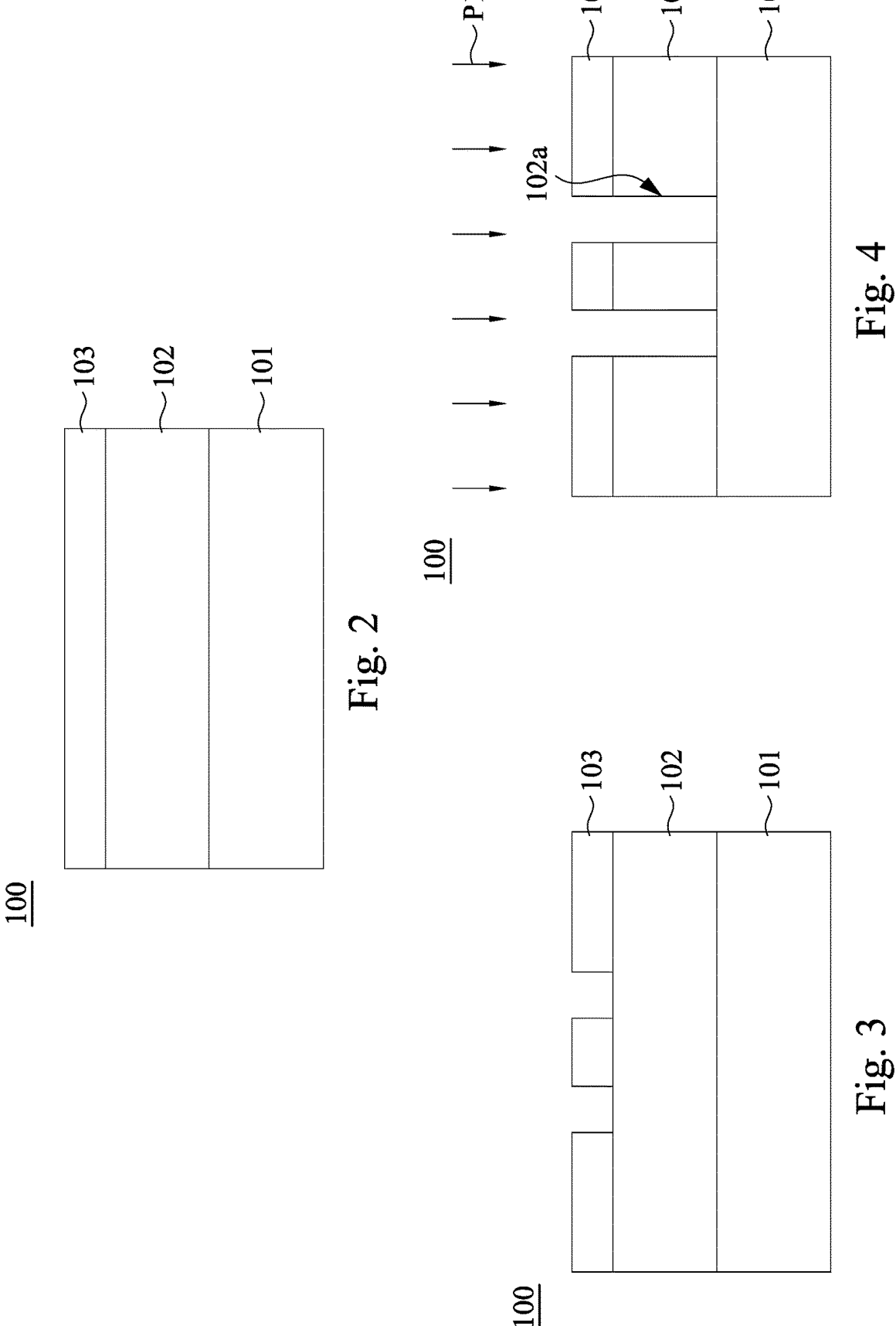

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In order to improve the conductivity of a multi-layer interconnect (MLI) of integrated circuit (IC) structure, a graphene layer may be formed on a metal line/via in the MLI. However, forming the graphene layer on the metal line/via may be performed at a temperature higher than about 400° C. which may be over a back-end-of-line (BEOL) thermal budget, which in turn impacts the performance of the IC structure. In addition, the graphene layer growing on a metal foil and formed by a high-temperature (e.g. higher than about 400° C.) thermal chemical vapor deposition (CVD) process may need to conduct an additional transferring process to transfer the growing graphene layer from the metal foil to a target substrate, such that the transferring process may damage elements on the IC structure, which in turn deteriorates the performance of the IC structure.

Therefore, the present disclosure in various embodiments provides a hot wire-chemical vapor deposition (HW-CVD) process performed at a low-temperature (e.g. lower than about 400° C.) with a pyrolyzation on a carbon precursor in advance to form a graphene layer and without an additional transferring process after the formation of the graphene layer. Specifically, during the CVD process, a carbon precursor is pyrolyzed with a hot wire in a process chamber, and then introduced to the catalytic metal interconnect (e.g., cobalt, ruthenium). The pyrolyzed carbon precursor can be decomposed on the catalytic metal interconnect at a temperature lower than about 400° C. Subsequently, the decomposed species were diffused into the bulk of the metal interconnect. Subsequently, upon cooling down, these active species can be segregated to the surface of the metal interconnect, and then a crystalline film can be formed by precipitation to form a graphene all-around interconnect.

Because the decomposition, the diffusion, and the segregation of the carbon precursor can be performed at a temperature under 400° C., a lower thermal budget to synthesize the graphene layer on the metal interconnect is reached, such that the performance of the IC structure can be improved. For example, the graphene layer can be formed on the MLI of the IC structure in the BEOL process with a temperature under 400° C. and without damaging the elements in the IC structure, which in turn increases the reliability of the IC structure. In addition, the graphene layer is formed all-around on the metal interconnect, which in turn increases breakdown current and prolongs the electromigration lifetime of the IC structure. Furthermore, because the graphene layer can be epitaxially grown on the catalytic metal interconnect directly, there is no need to perform an additional transferring process on the graphene layer, and thus fabrication of the IC structure will not result in additional processes that may damage the IC structure and hence additional cost.

Referring now to FIG. 1, illustrated is a flowchart of an exemplary method M for fabrication of a semiconductor structure 100 in accordance with some embodiments. The method M includes a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable. The method M includes fabrication of the semiconductor structure 100. However, the fabrication of the semiconductor structure is merely an example for describing the manufacturing process according to some embodiments of the present disclosure.

Figure 8A:
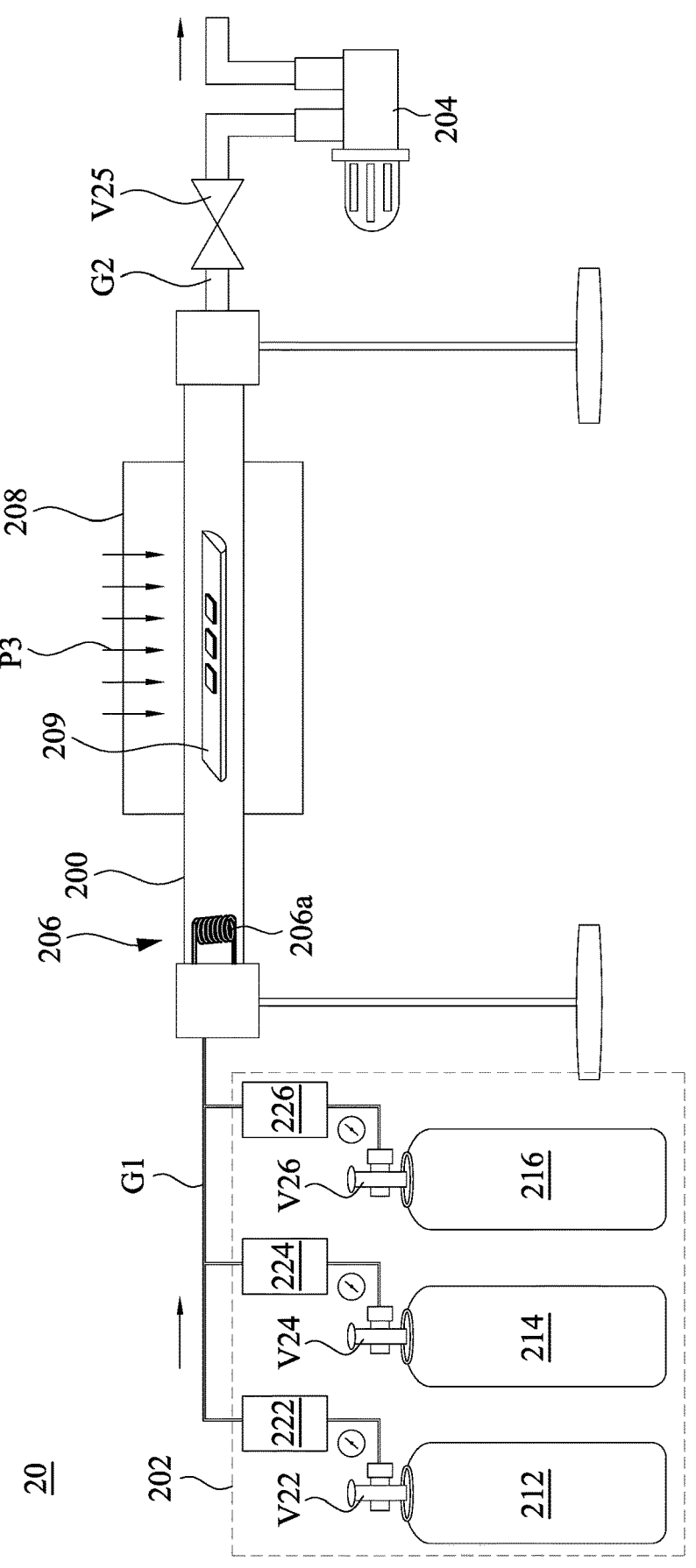
Figure 8B:
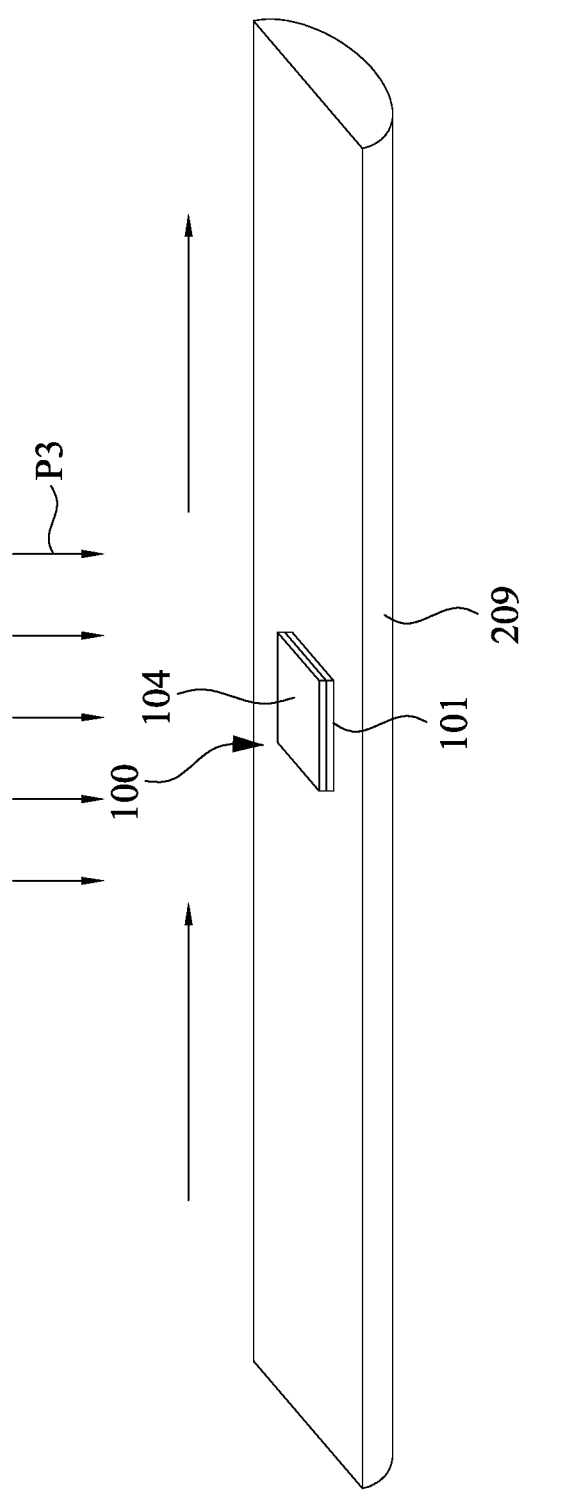
Figure 9B:
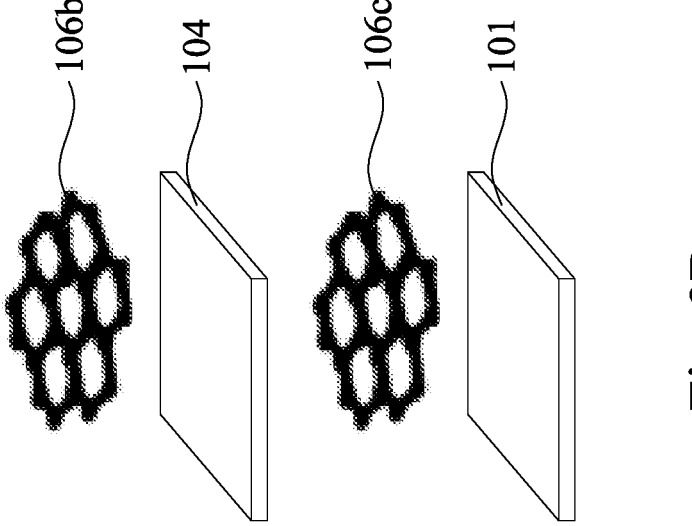
FIG. 9B is a schematic diagram of a semiconductor structure including upper and lower graphene layers on opposite surfaces of a metal layer in accordance with some embodiments of the present disclosure.
Figure 9A:
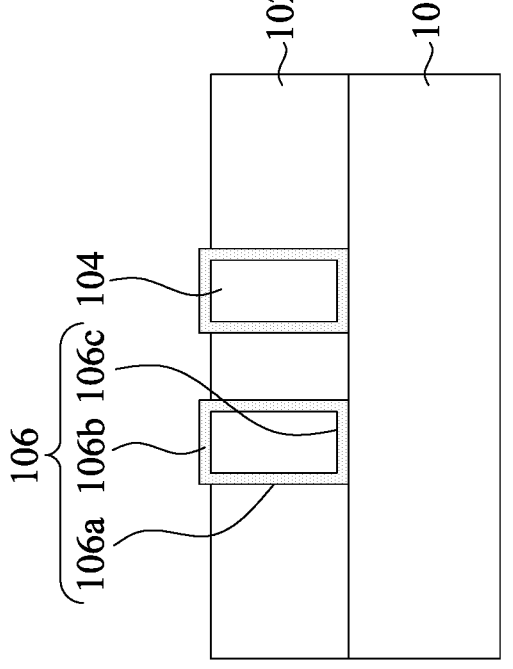
Figure 9D:
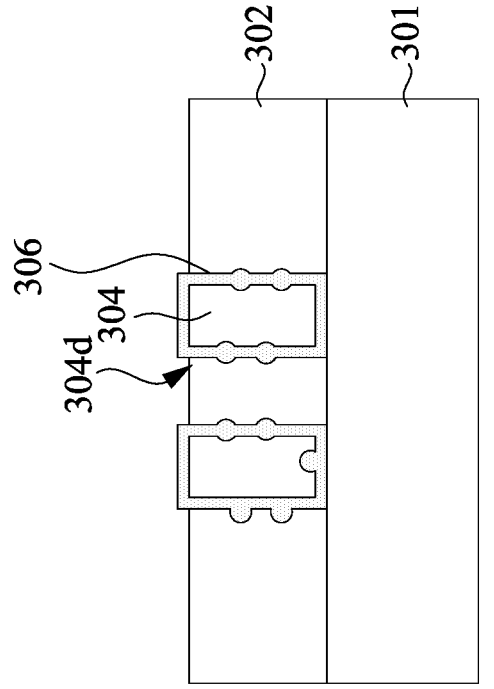
FIG. 9D illustrates a schematic diagram of a semiconductor structure corresponding to FIG. 9A in accordance with some embodiments of the present disclosure.
Figure 9C:
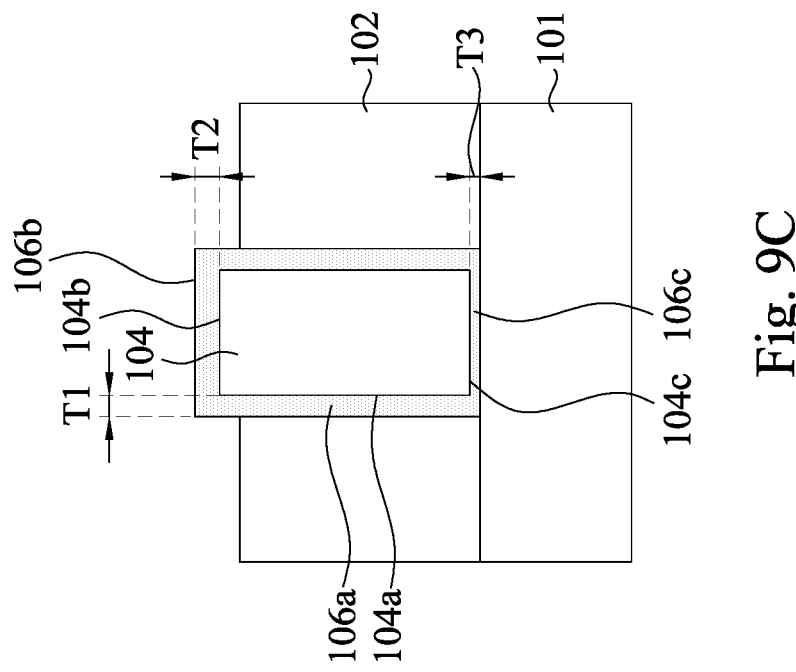
FIG. 9C illustrates a partial enlarged view of FIG. 9A.

Reference is made to FIGS. 2-5, 6A, and 7A-9C. FIGS. 2-5, 6A, and 7A-9A illustrate a method in various stages of forming the semiconductor structure 100 including a graphene layer in accordance with some embodiments of the present disclosure. FIG. 9B is a schematic diagram of a stacked structure including top and bottom graphene layers on opposite surfaces of a metal film in accordance with some embodiments of the present disclosure. FIG. 9C illustrates a partial enlarged view of FIG. 9A.

The method M begins at block S101 where a dielectric layer is formed over a substrate. Referring to FIG. 2, in some embodiments of block S101, a substrate 101 is provided. The substrate 101 may be a semiconductor substrate, such as a bulk semiconductor, a semiconductor-on-insulator (SOI) substrate, or the like, which may be doped (e.g., with a p-type or an n-type impurity) or undoped. The substrate 101 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 101 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

Subsequently, a dielectric layer 102 is formed over the substrate 101. The dielectric layer 102 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, the dielectric layer 102 may be formed of low-k dielectric materials. The dielectric constants (k values) of the low-k dielectric materials may be less than about 3.0, or less than about 2.5, for example. In some embodiments, the dielectric layer 102 may include multiple dielectric material and selected from a group including of $SiO_2$, $Si_3N_4$, carbon doped oxide, nitrogen doped oxide, porous oxide, air gap, or combinations thereof.

Referring back to FIG. 1, the method M then proceeds to block S102 where a photoresist layer is formed over the dielectric layer. With reference to FIG. 2, in some embodiments of block S102, a photoresist layer 103 is formed over the dielectric layer 102. In some embodiments, the photoresist layer 103 may be coated on the substrate 101 using a spin-on coating method. In some embodiments, the photoresist layer 103 may be a positive photoresist layer or a negative photoresist layer. In some embodiments, the photoresist layer 103 may be made of Poly (methyl methacrylate) (PMMA), Poly (methyl glutarimide) (PMGI), Phenol formaldehyde resin (DNQ/Novolac). In some embodiments, the photoresist layer 103 may further include a photosensitive element, such as a photo-acid generator (PAG). This allows a photolithography process to be performed to pattern the photoresist layer 103. In some embodiments, the photoresist layer 103 may be made of s a $C_xH_yO_z$ material.

Referring back to FIG. 1, the method M then proceeds to block S103 where the photoresist layer is patterned to form one or more first via holes, trenches, and/or openings therein. With reference to FIG. 3, in some embodiments of block S103, In some embodiments, the photoresist layer 103 can patterned by a photolithography process, which may include one or more exposure, developing, rinsing, and baking processes. The photolithography process patterns the photoresist layer 103 into a photoresist mask, which may have one or more via holes, trenches, and/or openings 103a that expose the dielectric layer 102 therebelow. The dielectric layer 102 is then etched using the photoresist layer 103 to form a patterned dielectric layer 102 (see FIG. 4). In some embodiments, the photoresist layer 103 can be interchangeably referred to as a hard mask layer.

Referring back to FIG. 1, the method M then proceeds to block S104 where the dielectric layer is etched to form one or more second via holes, trenches, and/or openings therein through the patterned photoresist layer. With reference to FIG. 4, in some embodiments of block S104, an etching process P1 is performed to pattern the dielectric layer 102 through the photoresist layer 103, such that the dielectric layer 102 is patterned to have a plurality of via holes, trenches, and/or openings 102a therein. In some embodiments, an etch rate of the substrate 101 is lower than an etch rate of the dielectric layer 102 during the etching process P1. By way of example but not limiting the present disclosure, a ratio of the etch rate of the dielectric layer 102 to the etch rate of the substrate 101 may be greater than about 5, such as about 5, 6, 7, 8, 9, or 10, during the etching process P1. In some embodiments, the etching process P1 may be a plasma etching process, for example the ICP process.

In some embodiments, an etching gas of the etching process P1 may include oxygen gas ($O_2$), carbon dioxide ($CO_2$) or other suitable etching gas. In some embodiments, an etching gas of the etching process P1 may include fluorine-containing gas, such as nitrogen hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), combinations thereof, or other suitable etching gas. In some embodiments, an etching gas of the etching process P1 may include $H_2$, $N_2$, and Ar. In some embodiments, the $CHF_3$ gas may serve as a main gas, and the $N_2$ and Ar gases may serve as assistant gases during the etching process P1. It is also understood that in alternative embodiments, other suitable gases may be used as a main gas instead of the $CHF_3$ gas.

Figure 5:
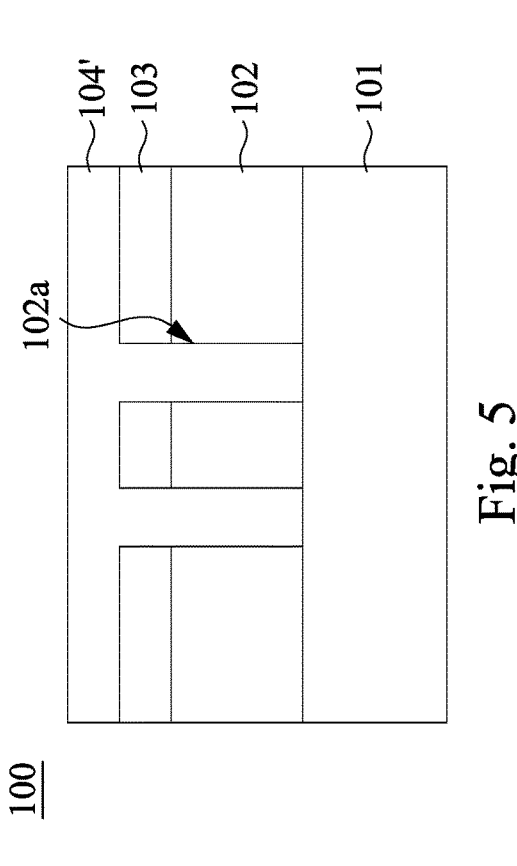

Referring back to FIG. 1, the method M then proceeds to block S105 where a conductive material is deposited over the dielectric layer and fills in the second via holes, trenches, and/or openings. With reference to FIG. 5, in some embodiments of block S105, a conductive material 104' is deposited over the dielectric layer 102 and fills in the second via holes, trenches, and/or openings 102a. In some embodiments, the patterned photoresist layer 103 is remained, and thus the conductive material 104' can also be deposited over the photoresist layer 103. In some embodiments, the method of forming the conductive material 104' may include CVD, PVD, ALD, or other suitable processes. In some embodiments, the conductive material 104' may include iron (Fe), cobalt (Co), nickel (Ni), copper (Cu), platinum (Pt), palladium (Pd), aluminum (Al), tungsten (W), ruthenium (Ru), Ti, Ta, TiN, TaN, proper alloys thereof, suitable materials, or combinations thereof. In some embodiments, the conductive material 104' may be made of nitride or silicide of a conductive material.

Referring back to FIG. 1, the method M then proceeds to block S106 where the excess portions of the conductive material over the dielectric layer are removed, such that the remainders of the conductive material in the second via holes, trenches, and/or openings are as conductive features. With reference to FIG. 6A, in some embodiments of block S106, the excess portions of the conductive material 102' (see FIG. 5) over the dielectric layer 102 and the photoresist layer 103 (see FIG. 5) are removed through a removal process P2, such as a chemical mechanical polishing (CMP)

process, or the like, forming the upper surface of the metal-filled opening substantially coplanar with a top surface of the dielectric layer 102. The remaining portions of the conductive material 104' (see FIG. 5) in the via holes, trenches, and/or openings 102a form the conductive features 104, such as conductive vias and/or conductive lines. In some embodiments, the conductive feature 104 can be interchangeably referred to as a conductive layer, a metal layer, a conductive line, a metal line, a conductive via, a metal via, a conductive film, a metal film, a conductive interconnect, a metal interconnect, a conductive wore, or a metal wire. In some embodiments, the conductive features 104 can act as a catalytic layer for growing a graphene layer, which will be discussed below, and thus the conductive features 104 can be interchangeably referred to as a catalytic feature or a catalytic metal layer.

Figure 6B:
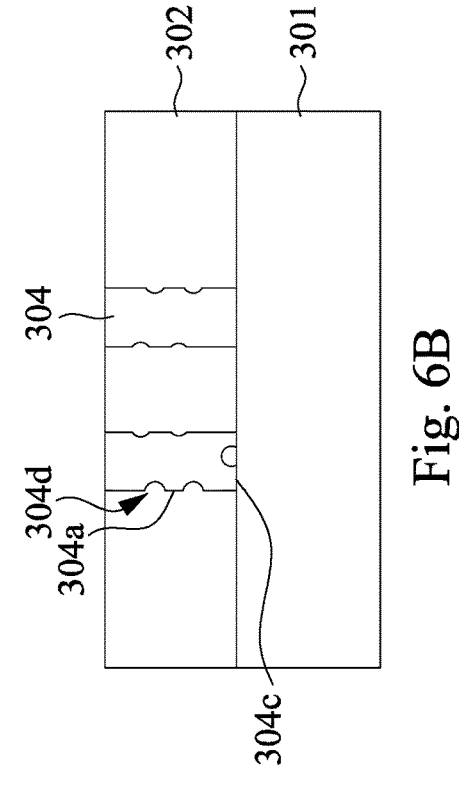
FIGS. 6B and 6C illustrate schematic diagram of semiconductor structures corresponding to FIG. 6A in accordance with some embodiments of the present disclosure.
Figure 6A:
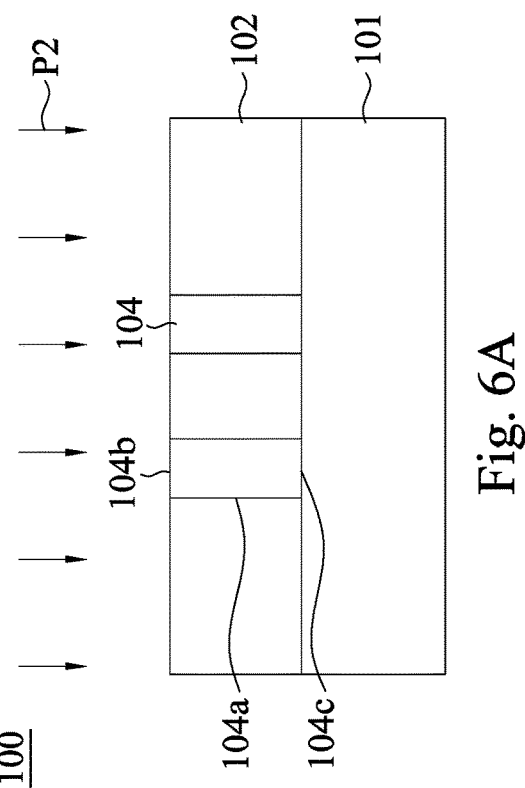
Figure 6C:
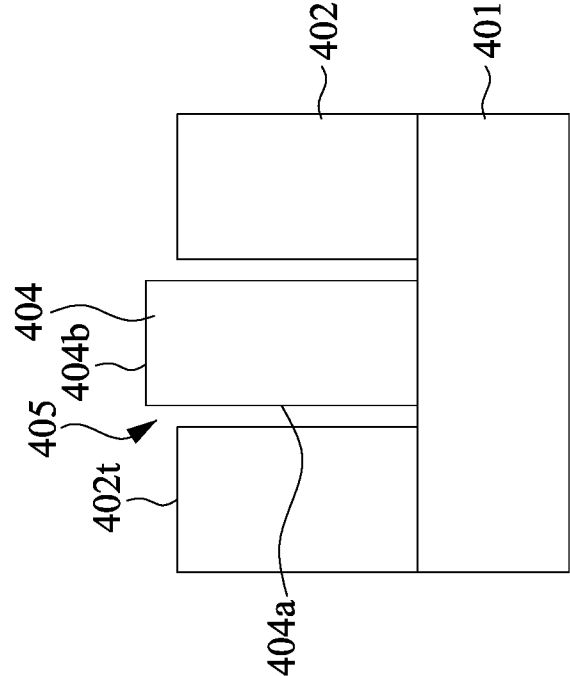

Reference is made to FIGS. 6B and 6C. FIGS. 6B and 6C illustrate schematic diagram of semiconductor structures corresponding to FIG. 6A in accordance with some embodiments of the present disclosure. While FIGS. 6B and 6C show some embodiments of the semiconductor structures having different cross-sectional profiles than the semiconductor structure 100 in FIG. 6A. FIG. 6A. The conductive feature 104 as shown in FIG. 6A may have a straight side surface 104a, a flat top surface 104b, and a flat bottom surface 104c thereof. The side surface 104a, the top surface 104b, and the bottom surface 104c of the conductive feature 104 are free of voids and/or recesses thereon. In some embodiments, the side surface 104a and the bottom surface 104c of the conductive feature 104 may have a plurality of voids and/or recesses thereon. The top surface 104b of the conductive feature 104 is flush with a top surface 102t of the dielectric layer 102, and the side surface 104a of the conductive feature 104 is in contact with the dielectric layer 102. In some embodiments, the conductive feature 104 can be formed to have the top surface 104b in a position higher than or lower than the top surface 102t of the dielectric layer 102. In some embodiments, the side surface 104a of the conductive feature 104 may be separated from the dielectric layer 102 by an air gap.

As shown in FIG. 6B, a conductive feature 304 may have side surfaces 304a and a bottom surface 304c that have a plurality of voids and/or recesses 304d thereon, such that the dielectric layer 302 may embedded in the voids and/or recesses 304d. In some embodiments, material and manufacturing method of a substrate 301, a dielectric layer 302, and the conductive feature 304 are substantially the same as those of the substrate 101, the dielectric layer 102, and the conductive feature 104 as shown in FIG. 6A, and the related detailed descriptions may refer to the foregoing paragraphs, and are not described again herein. As shown in FIG. 6C, a conductive feature 404 may have side surfaces 404a spaced apart from a dielectric layer 402 by an air gap 405, and a top surface 404b in a position higher than a top surface 402t of the dielectric layer 402. In some embodiments, material and manufacturing method of a substrate 401, the dielectric layer 402, and the conductive feature 404 are substantially the same as those of the substrate 101, the dielectric layer 102, and the conductive feature 104 as shown in FIG. 6A, and the related detailed descriptions may refer to the foregoing paragraphs, and are not described again herein.

Figure 7A:
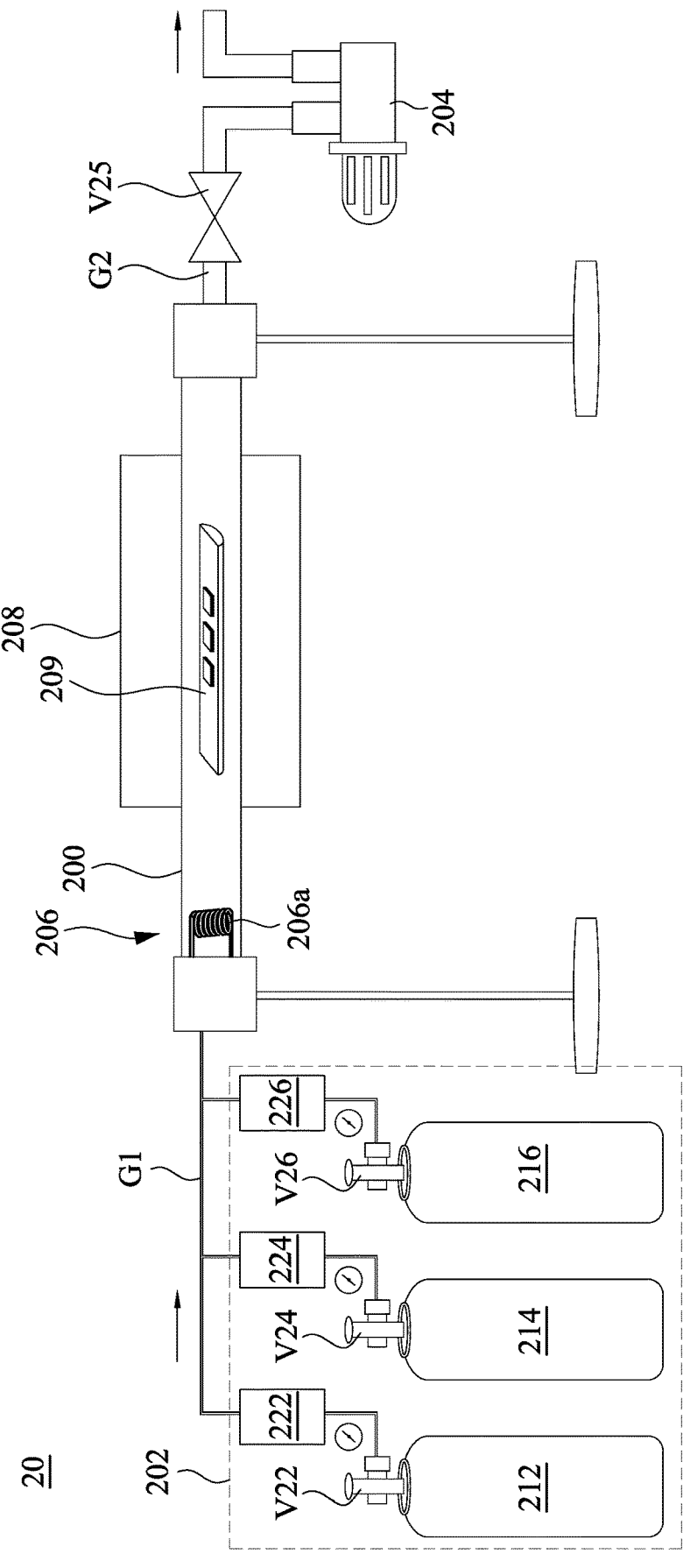
Figure 7B:
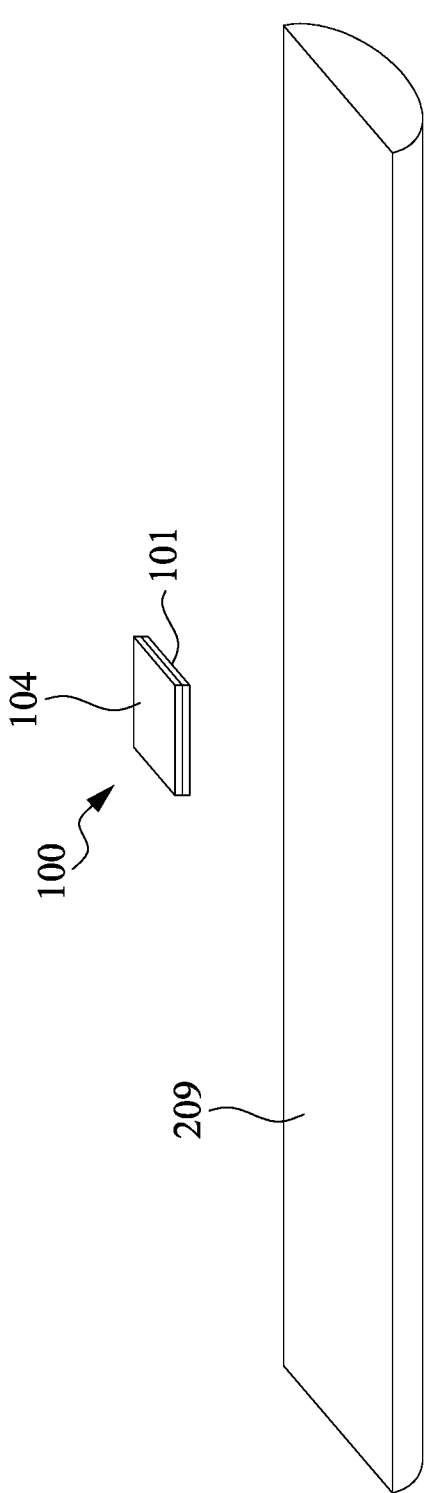

Referring back to FIG. 1, the method M then proceeds to block S107 where the substrate is moved into a processing chamber of a deposition system. With reference to FIGS. 7A and 7B, in some embodiments of block S107, the substrate 101 is moved into a processing chamber 200 of a deposition system 20 and on a carrier 209. In some embodiment, the deposition system 20 can be served as a chemical vapor deposition (CVD) system. This is described in greater detail with reference to FIG. 7A, which illustrate a schematic diagram of an exemplary deposition system 20 in some embodiments of the present disclosure. As shown in FIG. 7A, the deposition system 20 includes a processing chamber 200, a gas delivery system 202, a vacuum pump 204, a heating belt 206 defining a separate heating region to pyrolyze a carbon precursor from the gas delivery system 202, a heater 208 (e.g., furnace) used to dissociate the carbon precursor (e.g., hydrocarbon precursor) on a metal layer. In some embodiments, the gas delivery system 200 is connected to the processing chamber 200 via a gas delivery line G1, and the vacuum pump 204 is connected to the processing chamber 200 via a gas delivery line G2. The heater 208 surrounds an exterior of a portion of the processing chamber 200 near the gas delivery line G2. The heating belt 206 is between the gas delivery line G1 and the heater 208.

In some embodiments of FIG. 7A, the processing chamber 200 is an elongated tube extending laterally. By way of example but not limiting the present disclosure, the processing chamber 200 may be a quartz tube. In some embodiments, the gas delivery lines G1 and G2 are fluidly communicated with the processing chamber 200, in which the gas delivery lines G1 and G2 are fluidly communicated with opposite sides of the processing chamber 200. The processing chamber 200 can accommodate the substrate 101 having the dielectric layer 102 and the conductive feature 104 thereon. In some embodiments, the heating belt 206 includes a filament 206a coupled to a portion of the processing chamber 200 near the gas delivery line G1. The filament 206a may be made of tantalum (Ta), or other suitable conductive materials. In some embodiments, the filament 206a has a multiple turn cylindrical configuration that has about 5 to about 15 turns, such as about 5, 6, 7, 8, 9, 10, 11, 12, 13, 14, or 15, by way of example but not limiting the present disclosure. In some embodiments, the filament 206a may have a length in a range from about 10 cm to about 30 cm, such as about 10, 12, 14, 16, 18, 20, 22, 24, 26, 28, or 30 cm. In some embodiments, the filament 206a may have a wire diameter in a range from about 0.1 mm to about 0.4 mm, such as about 0.1, 0.15, 0.2, 0.25, 0.3, 0.35, or 0.4 mm. In some embodiments, the filament 206a may have a turn diameter in a range from about 2 mm to about 4 mm, such as about 2, 2.2, 2.4, 2.6, 2.8, 3, 3.1, 3.2, 3.4, 3.6, 3.8, or 4 mm. In some embodiments, the filament 206a can be interchangeably referred to as a hot wire.

The gas delivery system 202 will now be described. In some embodiments, the gas delivery system 202 includes several sources 212, 214, and 216. In the example shown in FIG. 7A, three sources are illustrated, while more or less sources may be applied in some other embodiments. The gas delivery system 202 includes several mass flow controllers 222, 224, 226, in which the mass flow controllers 222, 224, 226 are connected to the sources 212, 214, and 216 via valves V22, V24, V26, respectively. Moreover, the mass flow controllers 222, 224, 226 are connected to the gas delivery line G1 via valves V22, V24, V26, respectively. In some embodiments, the source 212 is a liquid source, and thus the source 212 may include a liquid tank. For example, the liquid of the source 212 may include liquid carbon-containing material. In some embodiments, the carbon elements of the carbon-containing material (e.g., methane, ethane, propane, ethene, propene, acetylene) are used as a source for depositing a graphene layer discussed below. On the other hand, the sources 214 and 216 are gas sources, and thus the sources 214 and 216 may include gas cylinders. The gases of the sources 214 and 216 may be, for example, $H_2$, Ar, $N_2$, $Cl_2$, or other suitable gases. The vacuum pump 204 is connected to the gas delivery line G2 via a valve V25. The remainder of the gas mixture exhausted from the processing chamber 200, including reaction products or byproducts, is evacuated from the processing chamber 200 by the vacuum pump 236.

A graphene layer can be grown epitaxially on a catalytic metal substrate (e.g., conductive feature 104) through the deposition system 20. The as-grown graphene layer can exhibit an ordered atomic arrangement as it followed an epitaxial relationship to the metal lattice of the catalytic metal substrate. During the growth, the catalytic metal substrate can aid the decomposition of the carbon precursor, and then the decomposed species were diffused into the bulk of the substrate. Upon cooling down, these active species can be segregated to the surface of the metal substrate, and then a thin layer of crystalline film can be formed by precipitation, which will be discussed below. Thicknesses of the graphene layer can be controlled through changing various growth parameters such as increasing growth duration and the quantity of precursor used.

Referring back to FIG. 1, the method M then proceeds to block S108 where a graphene layer is selectively formed on the conductive feature by a hot wire-chemical vapor deposition (HW-CVD) process. With reference to FIGS. 8A and 8B, in some embodiments of block S108, a HW-CVD process P3 is performed on the conductive feature 104. During the HW-CVD process P3, the substrate 101 and the conductive feature 104 are heated to a predetermined temperature, such as about 350 to 800° C. through the heater 208 in an atmosphere with a carrier gas mixture including hydrogen ($H_2$) and argon (Ar). The carrier gas mixture is introduced into the processing chamber 200 from the sources 214 and 216 through the gas delivery line G1. In some embodiments, the hydrogen carrier gas may be performed with a flow rate in a range from between about 50 sccm to about 200 sccm, such as about 50, 75, 100, 125, 150, 175, or 200 sccm. In some embodiments, the argon carrier gas may be performed with a flow rate in a range from between about 50 sccm to about 200 sccm, such as about 50, 75, 100, 125, 150, 175, or 200 sccm.

Subsequently, a carbon precursor in a gas state is introduced into the processing chamber 200 under a process pressure in a range from about 0.9 to about 1.1 Torr, such as about 0.9, 1, or 1.1 Torr, from the source 212. The carbon precursor may include a carbon-containing material, such as methane, ethane, propane, ethene, propene, acetylene, other suitable material, or combinations thereof. In some embodiments, the carbon precursor may be performed with a flow rate in a range from between about 3 sccm to about 100 sccm, such as about 3, 10, 20, 30, 40, 50, 60, 70, 80, 90, or 100 sccm. The carbon precursor is pyrolyzed by the filament 206a of the heating belt 206. The carbon precursor is cracked to broken the carbon precursor down into carbon atoms, by the breaking of carbon-carbon bonds and/or carbon-hydrogen bonds in the carbon precursor. In some embodiments, the filament 206a is performed to heat to a temperature that the carbon precursor can be pyrolyzed, the temperature can be in a range from about 2000 to 3000° C., such as about 2000, 2100, 2200, 2277, 2300, 2400, 2500, 2527, 2600, 2700, 2800, 2900, or 3000° C.

In some embodiments, the carbon rich environment is maintained for about 5 to about 30 minutes to allow the graphene layer 106 (see FIG. 9A) to grow on the conductive feature 104. Specifically, during the growth, the conductive feature 104 serving as a catalytic feature can aid the decomposition of the pyrolyzed carbon precursor. The pyrolyzed carbon precursor can dissociate on the surface of the conductive feature 104 to produce carbon atoms. Subsequently, the carbon atoms can be diffused into the bulk of the conductive feature 104 and between metal grain boundaries as evidenced by the lattice expansion of the metallic substrate at a process temperature in a range from about 350 to 800° C., such as about 350, 400, 450, 500, 550, 600, 650, 700, 750, or 800° C. In some embodiments, the process temperature range can depend on the selected carbon source or inorganic source of material. For example, when methane is used, the temperature for graphene growth can be higher than when benzene is used. In some embodiments, the temperature for graphene growth can be reduced when the dissociation of the carbon source is assisted by the application of, e.g., plasma, light, or laser. In some embodiment, pyrolyzing the carbon precursor includes providing a current in a range from about 4 to about 6 A, such as about 4, 4.5, 4.58, 5, 5.04, 5.5, or 6 A, on the filament 206a (see FIG. 8A).

Subsequently, the conductive feature 104 is cooled down. Upon cooling down, because the conductive feature 104 has a low solubility for carbon at a low temperature (e.g., lower than about 350° C.) than at a higher temperature (e.g., higher than about 350° C.), these active species (i.e., carbon atoms) can be segregated to the surface of the conductive feature 104, and thus a thin layer of crystalline film (i.e., graphene layer 106 as shown in FIG. 9A) is formed by precipitation. Specifically, the conductive feature 104 is cooled to a temperature lower than about 350° C., such as about 350, 300, 250, 200, 150, 100, 50, or 25° C., at a cooling rate of about 20° C./min, in which the same gas condition is maintained from the beginning of graphene growth stage to the end of the cooling stage. The process conditions, such as temperature, gas pressures, and the time period for annealing and graphene growth are provided as examples. Other process conditions can also be used. Therefore, the carbon atoms aggregate and form the graphene layer 106 at the side, top, and bottom surfaces 104a, 104b, and 104c of the conductive feature 104. The graphene layer 106 formed on the side surface 104a of the conductive feature 104 can be referred to as "sidewall graphene layer 106a," the graphene layer 106 formed on the top surface 104b of the conductive feature 104 can be referred to as "top graphene layer 106b," and the graphene layer 106 formed on the bottom surface 104c of the conductive feature 104 can be referred to as "bottom layer graphene 106c." In some embodiment, after cooling down, a carbon residue may remain in the bulk of the conductive feature 104.

A physical property of the conductive feature 104 can be described by carbon solubility (at. ppm) at a specific temperature. In some embodiments, the conductive feature 104 can be made of a material having carbon solubility lower than about 35,000 at. ppm at about 1000° C. By way of example but not limiting the present disclosure, the conductive feature 104 may be made of a material, such as cobalt, having carbon solubility about 10,000 at. ppm at about 1000° C. The conductive feature 104 may be made of a material, such as ruthenium, having carbon solubility about 2,300 at. ppm at about 900° C. The conductive feature 104 may be made of a material, such as nickel, having carbon solubility about 9,000 at. ppm at about 900° C. The conductive feature 104 may be made of a material, such as platinum, having carbon solubility about 11,000 at. ppm at about 1000° C. The conductive feature 104 may be made of a material, such as palladium, having carbon solubility about 33,000 at. ppm at about 1000° C. In some embodiments, the conductive feature 104 can have higher carbon solubility than the dielectric layer 102.

Therefore, the present disclosure in various embodiments provides the HW-CVD process P3 performed at a low-temperature (e.g. lower than about 400° C.) with the pyrolyzation on a carbon precursor in advance and without an additional transferring process after the formation of the graphene layer 106. Specifically, during the HW-CVD process P3, a carbon precursor is pyrolyzed with the filament 206a of the heating belt 206 in the processing chamber 200, and then introduced to the conductive feature 104. The pyrolyzed carbon precursor can be decomposed on the conductive feature 104 as the catalytic metal at a temperature lower than about 400° C. Subsequently, the decomposed species can be diffused into the bulk of the conductive feature 104. Subsequently, upon cooling down, these active species can be segregated to the surface of the conductive feature 104, and then a crystalline film can be formed by precipitation to form the graphene all-around conductive feature 104.

Because the decomposition, the diffusion, and the segregation of the carbon precursor can be performed at a temperature under 400° C. a lower thermal budget to synthesize the graphene layer 106 on the conductive feature 104 is reached, such that the performance of the IC structure can be improved. In addition, the graphene layer 106 is formed all-around on the conductive feature 104, which in turn increases breakdown current and prolongs the electromigration lifetime of the IC structure. Furthermore, because the graphene layer 106 can be epitaxially grown on the conductive feature 104 directly, there is no need to perform an additional transferring process on the graphene layer 106, and thus fabrication of the IC structure will not result in additional processes that may damage the IC structure and hence additional cost.

Referring back to FIG. 1, the method M then proceeds to block S109 where the substrate is moved out from the processing chamber of the deposition system. With reference to FIG. 9A, in some embodiments of block S109, after the heater 208 (see FIG. 8A) is turned off, the substrate 101 is moved out from the processing chamber 200 (see FIG. 8A) of the deposition system 20. In some embodiments, before moving out the substrate 101 from the processing chamber 200, the valve 212 of the gas delivery system 202 may be turned off, so as to stop providing carbon-containing precursor into the processing chamber 200. As shown in FIG. 9B, the graphene layer 106 can be epitaxially grown on the conductive feature 104 to form crystalline films. As shown in FIG. 9C, the graphene layer 106 is formed all-around on the conductive feature 104 and includes the sidewall graphene layer 106a (see FIG. 9C), the top graphene layer 106b, and the bottom layer graphene 106c from the cross sectional view. In some embodiments, the graphene layer 106 may have a thickness in a range from about 0.2 nm to about 200 nm, such as about 0.2, 0.3, 0.4, 0.5, 0.6, 0.7, 0.8, 0.9, 1, 10, 20, 30, 40, 50, 60, 70, 80, 90, 100, 110, 120, 130, 140, 150, 160, 170, 180, 109, or 200 nm.

In some embodiments, the sidewall graphene layer 106a may be squeezed between the side surface 104a of the conductive feature 104 and the dielectric layer 103, and the bottom layer graphene 106c may be squeezed between the bottom surface 104c of the conductive feature 104 and the substrate 101, and thus the sidewall graphene layer 106a may have a thinner thickness T1 (see FIG. 9C) than a thickness T2 (see FIG. 9C) of the top graphene layer 106b, and the bottom surface 104c may have a thinner thickness T3 than the thickness T1 of the sidewall graphene layer 106a. In some embodiments, the bottom surface 104c may have a same thickness T3 (see FIG. 9C) as the thickness T1 of the sidewall graphene layer. By way of example but not limiting the present disclosure, the top graphene layer 106b may have a thickness in a range from about 0.2 to about 5 nm, such as about 0.2, 0.3, 0.34, 0.5, 0.7, 0.9, 1, 1.5, 2, 2.5, 3, 3.4, 3.5, 4, 4.5, or 5 nm, the sidewall graphene layer 106a may have a thickness in a range from about 0.2 to about 3 nm, such as about 0.2, 0.3, 0.34, 0.5, 0.7, 0.9, 1, 1.02, 1.5, 2, 2.5, or 3 nm, and the bottom graphene layer 106c may have a thickness in a range from about 0.2 to about 3 nm, such as about 0.2, 0.3, 0.34, 0.5, 0.7, 0.9, 1, 1.02, 1.5, 2, 2.5, or 3 nm.

Reference is made to FIG. 9D. FIG. 9D illustrates a schematic diagram of a semiconductor structure corresponding to FIG. 9A in accordance with some embodiments of the present disclosure. While FIG. 9D shows an embodiment of the semiconductor structure with a different profile than the semiconductor structure in FIG. 9A. In FIG. 9D, a graphene layer 306 is formed on the structure as shown in FIG. 6B by the HW-CVD process P3 (see FIG. 8A). Specifically, the pyrolyzed carbon precursor can be decomposed on the conductive feature 304 as the catalytic metal at a temperature lower than about 400° C. Subsequently, the decomposed species can be diffused into the bulk of the conductive feature 304 having the voids and/or recesses 304d thereon. Subsequently, upon cooling down, these active species can be segregated to the surface of the conductive feature 304, and then a crystalline film as a graphene layer 306 can be formed by precipitation to form the graphene all-around conductive feature 304, and the graphene layer 306 fill the voids and/or recesses 304d of the conductive feature 304.

Raman spectroscopy is a characterization technique for the graphene layer 106. Carbon-based materials, such as graphene, may have three intense Raman features including a defect band (D band), a band related to in-plan vibration of sp2 carbon (G band), a stacking order (2D band), and an overtone of D and G band (D+G band). For monolayer graphene, the g band has a Raman Shift located at about 1580 cm$^{-1}$, the d band has a Raman Shift located at about 1350 cm$^{-1}$, the 2d band has a raman shift located at about 2700 cm$^{-1}$, and the D+G band has a raman shift located at about 2900 cm$^{-1}$. The relative intensity (a.u.) of the g band frequency of Raman spectra may be used as a measure for a number of features that provide information regarding sample purity, geometry, and the metallic or semi-conducting nature of the material. Another prominent feature in the Raman spectra of carbon-based materials is the d band. The d band is sensitive to differences in the carbon network that is characteristic of many carbon-based materials, and the intensity of the d band may provide information on the electronic character of a particular material. Because a carbon lattice may contain aromatic carbons that are sp2 hybridized and may be substantially more conductive, it may be beneficial to select for the graphene layer GL having fewer numbers of non-aromatic sp3 hybridized carbon sites, or "defects" in the carbon lattice. For example, higher intensity in the d band in a Raman spectrum may indicate that a particular sample has a higher concentration of defects and may not be as conductive as a sample having a relatively lower d band intensity.

Figures 10A, 10B:
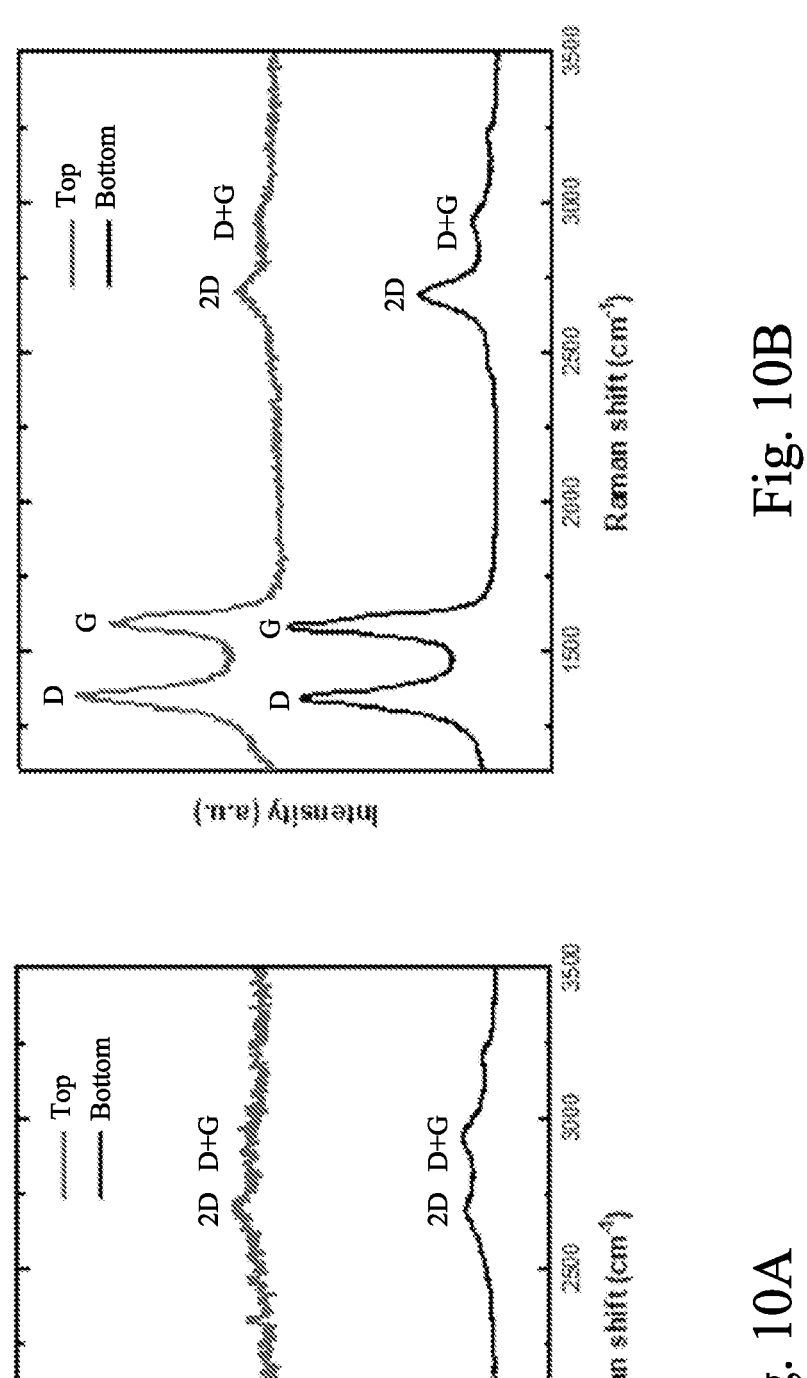
FIGS. 10A and 10B illustrate experimental results of a Raman spectrum of graphene formed on a metal layer with different operation temperatures of the RF (radio frequency) source.
Figure 10D:
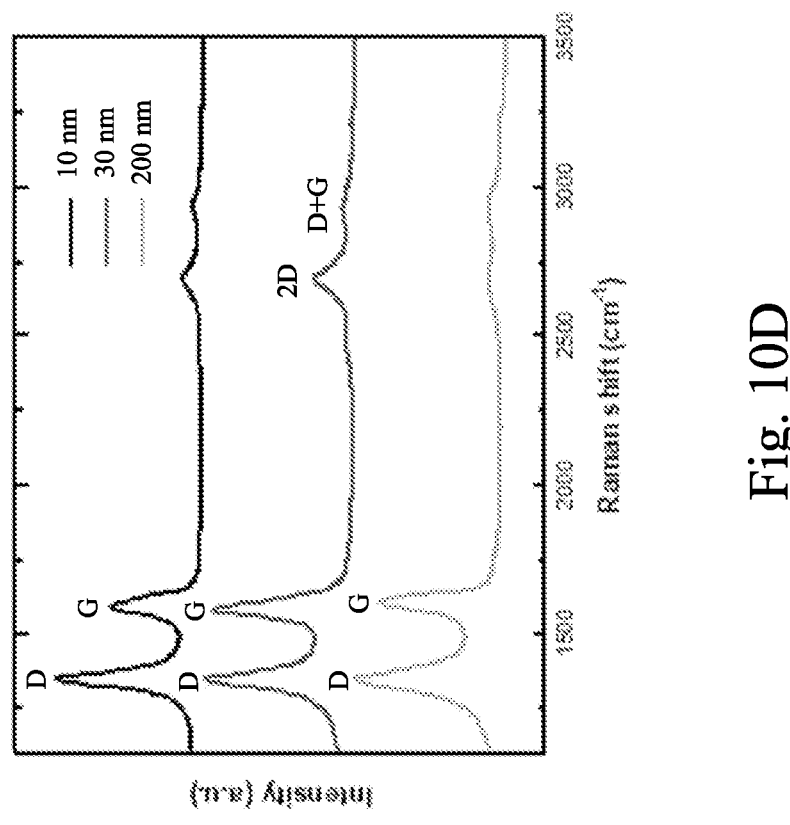
FIGS. 10C and 10D illustrate experimental results of a Raman spectrum of graphene formed on metal layers with different thicknesses.
Figure 10C:
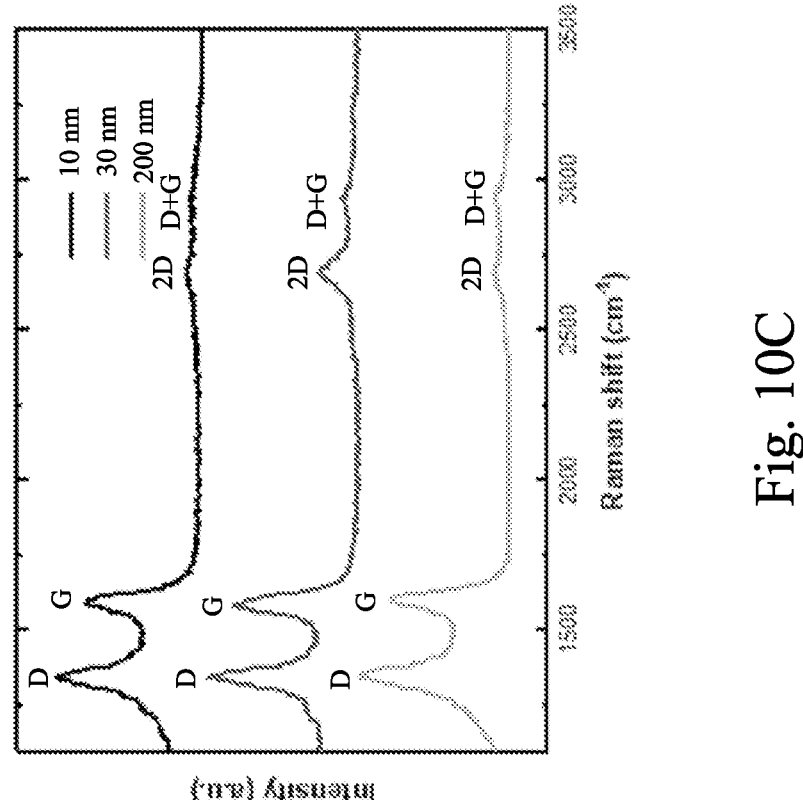
Figure 10F:
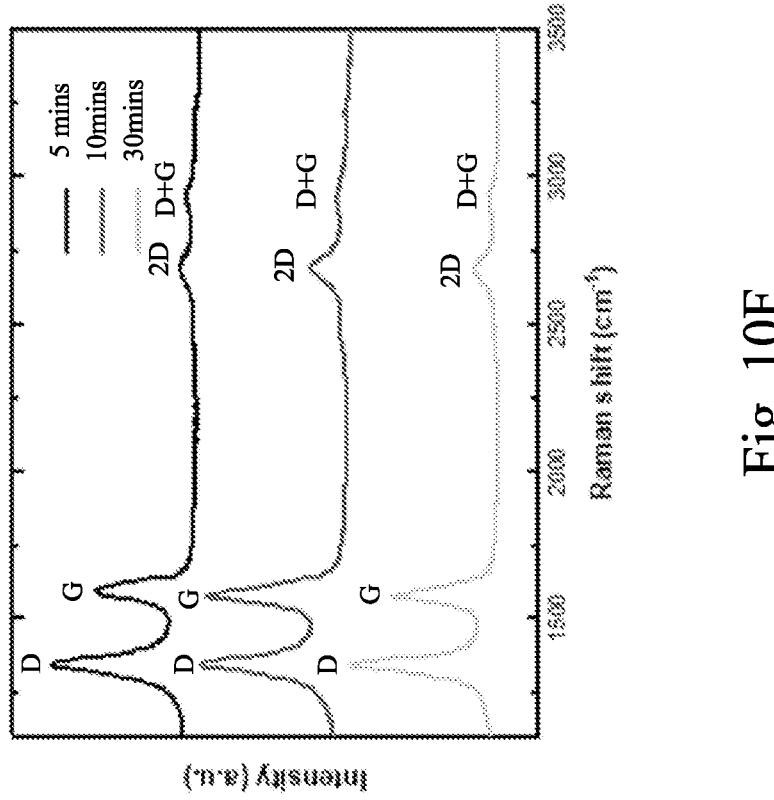
FIGS. 10E and 10F illustrate experimental results of a Raman spectrum of graphene formed on a metal layer with different operation time durations.
Figure 10E:
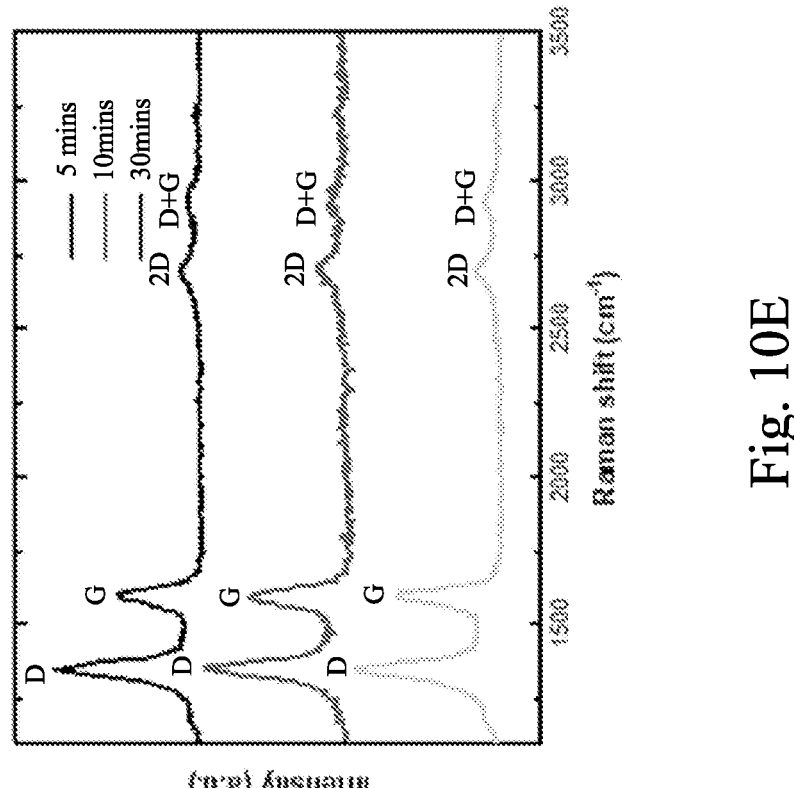

Reference is made to FIGS. 10A to 10F illustrating experimental results of Raman spectrum of graphene formed over a catalytic metal. FIGS. 10A and 10B illustrate experimental results of a Raman spectrum of graphene formed on a metal layer with different operation temperatures of the RF (radio frequency) source. FIGS. 10C and 10D illustrate experimental results of a Raman spectrum of graphene formed on metal layers with different thicknesses. FIGS. 10E and 10F illustrate experimental results of a Raman spectrum of graphene formed on a metal layer with different operation time durations.

In FIGS. 10A and 10B, the samples including a graphene layer formed by a carbon precursor on a catalytic metal (e.g., cobalt) at different temperatures obtained from the HW-CVD process P3 described above were prepared and intensities of Raman shift of the graphene layer were measured, in which FIG. 10A shows the sample performed at 380° C., and FIG. 10B shows the sample performed at 440° C. FIGS. 10A and 10B each show a comparison of a Raman spectrum for a top graphene layer (e.g. top graphene layer 106b shown in FIG. 9C) and a Raman spectrum for a bottom graphene layer (e.g. top graphene layer 106c shown in FIG. 9C). In some embodiments, the HW-CVD process P3 can be performed on the samples of FIGS. 10A and 10B at a process duration about 15 minutes. For the sample performed at 380° C. shown in FIG. 10A, the top and bottom graphene layers each has a g band having a Raman Shift located at about 1580 cm$^{-1}$, the d band having a Raman Shift located at about 1350 cm$^{-1}$, the 2d band having a Raman Shift located at about 2700 cm$^{-1}$, and the D+G band having a Raman Shift located at about 2900 cm$^{-1}$, suggesting that the top and bottom graphene layers are highly graphitized, which is consistent with the High-resolution transmission electron microscopy (HRTEM) image (not shown) of the sample. For the sample performed at 440° C. shown in FIG. 10B, the top and bottom graphene layers each has a g band having a Raman Shift located at about 1580 cm$^{-1}$, the d band having a Raman Shift located at about 1350 cm$^{-1}$, the 2d band having a Raman Shift located at about 2700 cm$^{-1}$, and the D+G band having a Raman Shift located at about 2900 cm$^{-1}$, suggesting that the top and bottom graphene layers are highly graphitized, which is consistent with the HRTEM image (not shown) of the sample. Therefore, as shown in the experimental results of FIGS. 10A and 10B, by using the HW-CVD process P3 described above, graphene all-around on the catalytic metal can be achieved to increase breakdown current and prolong the electromigration lifetime of the IC structure. In some embodiments, when a lower growth temperature (e.g., 380° C.) is used, it may be difficult to form continuous graphene layers on the catalytic metal, and the d band in the Raman spectrum may be high. This is likely due to poor graphitization at low temperature. When the growth temperature is higher than 800° C., the defect level of the graphene layers is also high. This may be due to the segregation of carbon species at the copper-silicon oxide interface being faster than the graphitization process.

In FIGS. 10C and 10D, the samples including a graphene layer formed by a carbon precursor on catalytic metal (e.g., cobalt) with different thicknesses were prepared and intensities of Raman shift of the graphene layer were measured, in which the graphene layers are formed by the HW-CVD process P3 described above, FIG. 10C shows a Raman spectrum for top graphene layers on catalytic metals with different thicknesses, and FIG. 10B shows a Raman spectrum for bottom graphene layers on catalytic metals with different thicknesses. In some embodiments, the HW-CVD process P3 can be performed on the samples of FIGS. 10C and 10D at a graphene growing temperature about 380° C. by the heater 208 (see FIG. 8A) of the deposition system 20, such that the graphene layers of the samples in FIGS. 10C and 10D may have thicknesses in a range from about 10 nm to about 200 nm. FIGS. 10A and 10B each show a comparison of a Raman spectrum for catalytic metals with thicknesses in 10, 30, and 200 nm. According to the sample for the top graphene layers shown in FIG. 10C, the top graphene layers growing on the catalytic metals with thicknesses in 10, 30, and 200 nm each has a g band having a Raman Shift located at about 1580 cm$^{-1}$, the d band having a Raman Shift located at about 1350 cm$^{-1}$, the 2d band having a Raman Shift located at about 2700 cm$^{-1}$, and the D+G band having a Raman Shift located at about 2900 cm$^{-1}$, suggesting that the top graphene layers on catalytic metals with different thicknesses are highly graphitized, which is consistent with the HRTEM image (not shown) of the sample. According to the sample for the bottom graphene layers shown in FIG. 10D, the bottom graphene layers growing on the catalytic metals with thicknesses in 10, 30, and 200 nm each has a g band having a Raman Shift located at about 1580 cm$^{-1}$, the d band having a Raman Shift located at about 1350 cm$^{-1}$, the 2d band having a Raman Shift located at about 2700 cm$^{-1}$, and the D+G band having a Raman Shift located at about 2900 cm$^{-1}$, suggesting that the bottom graphene layers on catalytic metals with different thicknesses are highly graphitized, which is consistent with the HRTEM image (not shown) of the sample. Therefore, as shown in the experimental results of FIGS. 10C and 10D, by using the HW-CVD process P3 described above, graphene all-around on the catalytic metal can be achieved to increase breakdown current and prolong the electromigration lifetime of the IC structure.

In FIGS. 10E and 10F, the samples including a graphene layer formed by a carbon precursor on catalytic metal (e.g., cobalt) with different operation time durations were prepared and intensities of Raman shift of the graphene layer were measured, in which the graphene layers are formed by the HW-CVD process P3 described above, FIG. 10E shows a Raman spectrum for top graphene layers growing on catalytic metals and with different growing time durations, and FIG. 10F shows a Raman spectrum for bottom graphene layers growing on catalytic metals and with different growing time durations. In some embodiments, the catalytic metal (e.g., cobalt) in the samples of FIGS. 10E and 10F may have a thickness about 30 nm. In some embodiments, the HW-CVD process P3 can be performed on the samples of FIGS. 10E and 10F at a graphene growing temperature about 380° C. by the heater 208 (see FIG. 8A), and at a process duration in a range from about to about 30 minutes. FIGS. 10E and 10F each show a comparison of a Raman spectrum for different growing time durations (e.g., about 5, 15, and 30 minutes) of graphene layers. According to the sample for the top graphene layers shown in FIG. 10E, the top graphene layers growing at time durations in 5, 15, and 30 minutes each has a g band having a Raman Shift located at about 1580 cm$^{-1}$, the d band having a Raman Shift located at about 1350 cm$^{-1}$, the 2d band having a Raman Shift located at about 2700 cm$^{-1}$, and the D+G band having a Raman Shift located at about 2900 cm$^{-1}$, suggesting that the top graphene layers for different growing time durations are highly graphitized, which is consistent with the HRTEM image (not shown) of the sample. According to the sample for the bottom graphene layers shown in FIG. 10F, the bottom graphene layers growing at time durations in 5, 15, and 30 minutes each has a g band having a Raman Shift located at about 1580 cm$^{-1}$, the d band having a Raman Shift located at about 1350 cm$^{-1}$, the 2d band having a Raman Shift located at about 2700 cm$^{-1}$, and the D+G band having a Raman Shift located at about 2900 cm$^{-1}$, suggesting that the top graphene layers for different growing time durations are highly graphitized, which is consistent with the HRTEM image (not shown) of the sample. Therefore, as shown in the experimental results of FIGS. 10E and 10F, by using the HW-CVD process P3 described above, graphene all-around on the catalytic metal can be achieved to increase breakdown current and prolong the electromigration lifetime of the IC structure.

Figure 11B:
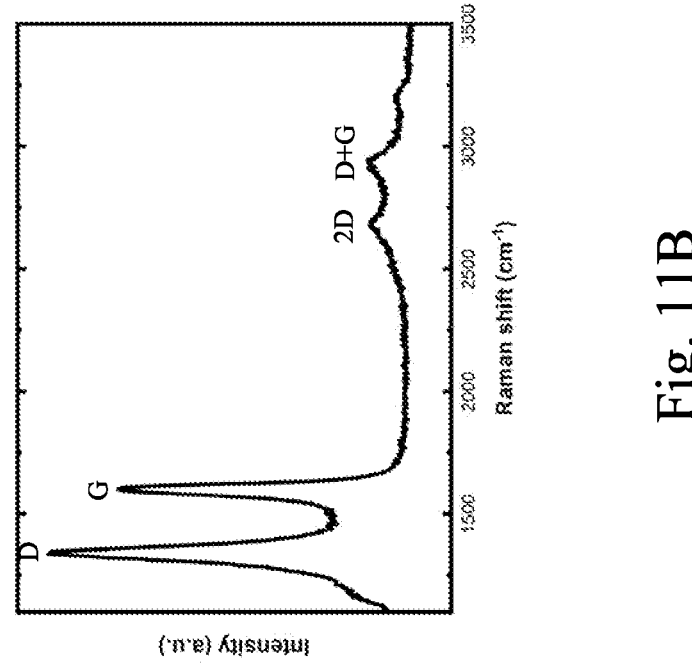
FIG. 11B illustrates an experimental result of a Raman spectrum of graphene formed over a metal wire.
Figure 11A:
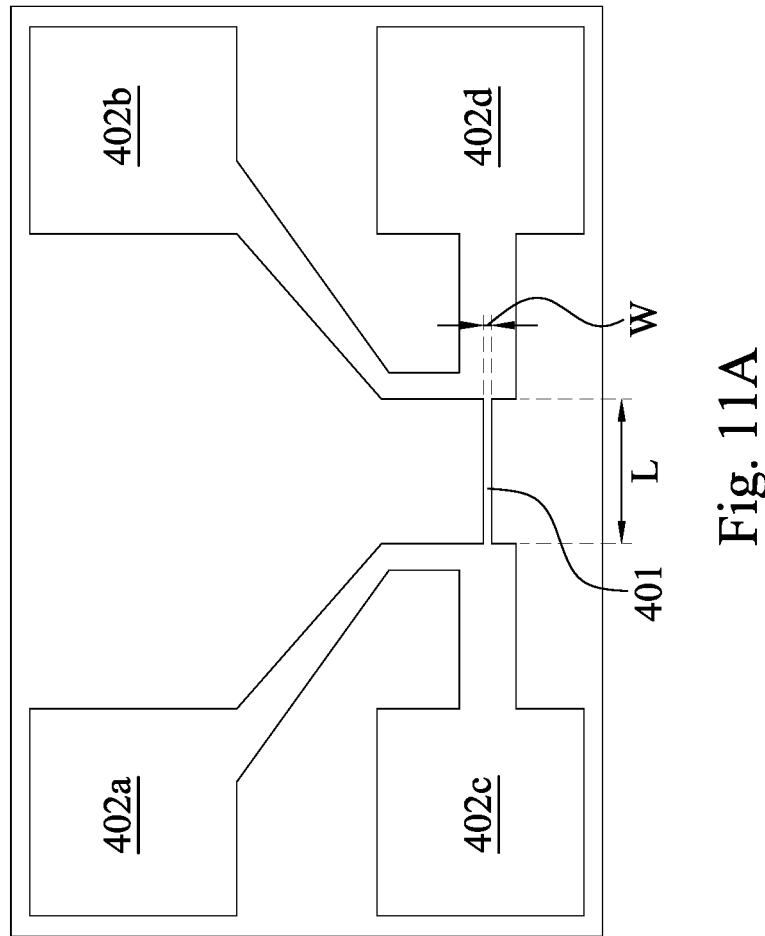
FIG. 11A is a schematic diagram of a metal wire breakdown current test system in accordance with some embodiments of the present disclosure.
Figure 11C:
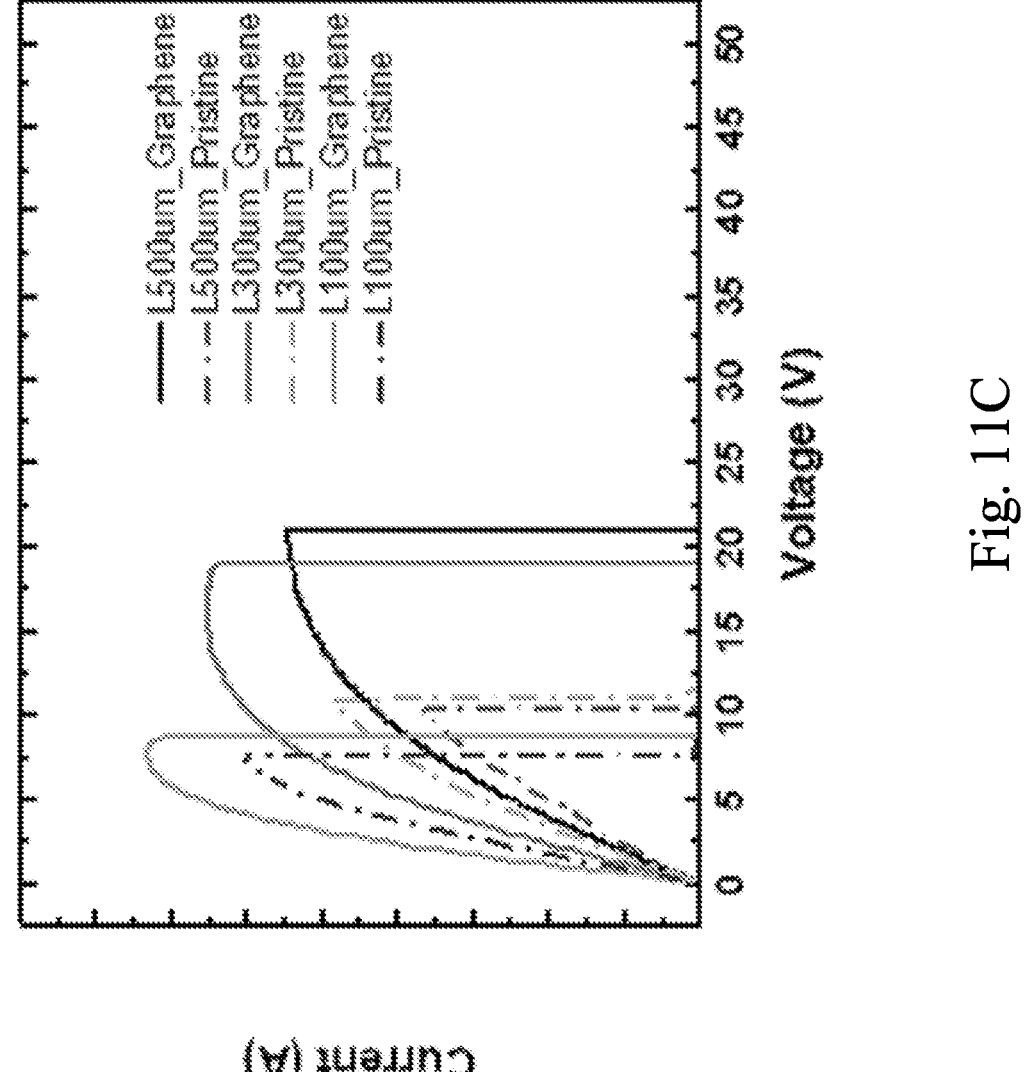
FIG. 11C illustrates an experimental result of metal wire breakdown currents with different lengths of the metal wires having graphene layers thereon, respectively.

Reference is made to FIGS. 11A-11C. FIG. 11A is a schematic diagram of a metal wire breakdown current test system in accordance with some embodiments of the present disclosure, wherein the metal wire has a graphene layer growing thereon. As shown in FIG. 11A, a schematic diagram of a metal wire breakdown current test system 40a including a metal wire 401 and a graphene layer formed on the metal wire. In some embodiments, the graphene layer wraps around the metal wire 404 (not shown). The metal wire 401 has a length L and a width W. In some embodiments, the width W of the metal wire 401 is about 5 μm. In some embodiments, the metal wire 401 has a catalytic metal (e.g., cobalt) coating thereon, the catalytic metal may have a thickness about 180 nm, and the graphene layer is formed on the catalytic metal. In other words, the catalytic metal is sandwiched between the metal wire 401 and the graphene layer. The HW-CVD process P3 as shown in FIG. 8A is performed on the catalytic metal at a graphene growing temperature about 380° C. and at a process duration about 15 minutes, by way of example but not limiting the present disclosure.

FIG. 11B illustrates an experimental result of Raman spectrum of graphene formed over the metal wire 401. In some embodiments, the graphene layer is formed by the HW-CVD process P3 described above. The graphene layer growing on the metal wire 401 has a g band having a Raman Shift located at about 1580 cm$^{-1}$, the d band having a Raman Shift located at about 1350 cm$^{-1}$, the 2d band having a Raman Shift located at about 2700 cm$^{-1}$, and the D+G band having a Raman Shift located at about 2900 cm$^{-1}$, suggesting that the graphene layer on the metal wire 401 is highly graphitized, which is consistent with the HRTEM image (not shown) of the metal wire 401 with the graphene layer growing thereon. Therefore, as shown in the experimental results of FIG. 11B, by using the HW-CVD process P3 described above, graphene all-around on the metal wire 401 can be achieved to increase breakdown current and prolong the electromigration lifetime of the IC structure. In some embodiments, the graphene layer growing on the metal wire 401 can be interchangeably referred to as a top graphene layer.

FIG. 11C illustrates experimental results of metal wire breakdown currents with different lengths of the metal wires, respectively. The experiment is performed by using the metal wire breakdown current test system 40 as shown in FIG. 11A, in which each test in the experiment uses different lengths L of the metal wire 401, such as about 100, 300, and 500 μm. The metal wire breakdown current test system 40 has a plurality probing pads (e.g., probing pads 402a, 402b, 402c, and 402b) to touch probes (not shown) to detect the resistance on the metal wire 401. According to the tests for the metal wire 401 having a length L about 100 μm, if the metal wire 401 is free from being coated with a graphene layer thereon, the breakdown current of the metal wire 401 is about 0.12281; if the metal wire 401 is coated with a graphene layer thereon, the breakdown current of the metal wire 401 is about 0.14669, such that a breakdown current ratio of the aforementioned breakdown current is about 1.19 indicated that the metal wire 401 coated with the graphene layer can have a higher breakdown current than the metal wire 401 free from being coated with a graphene layer thereon. According to the tests for the metal wire 401 having a length L about 300 μm, if the metal wire 401 is free from being coated with a graphene layer thereon, the breakdown current of the metal wire 401 is about 0.09758; if the metal wire 401 is coated with a graphene layer thereon, the breakdown current of the metal wire 401 is about 0.13079, such that a breakdown current ratio of the aforementioned breakdown current is about 1.34 indicated that the metal wire 401 coated with the graphene layer can have a higher breakdown current than the metal wire 401 free from being coated with a graphene layer thereon. According to the tests for the metal wire 401 having a length L about 500 μm, if the metal wire 401 is free from being coated with a graphene layer thereon, the breakdown current of the metal wire 401 is about 0.07396; if the metal wire 401 is coated with a graphene layer thereon, the breakdown current of the metal wire 401 is about 0.11825, such that a breakdown current ratio of the aforementioned breakdown current is about 1.6 indicated that the metal wire 401 coated with the graphene layer can have a higher breakdown current than the metal wire 401 free from being coated with a graphene layer thereon.

Figure 12A:
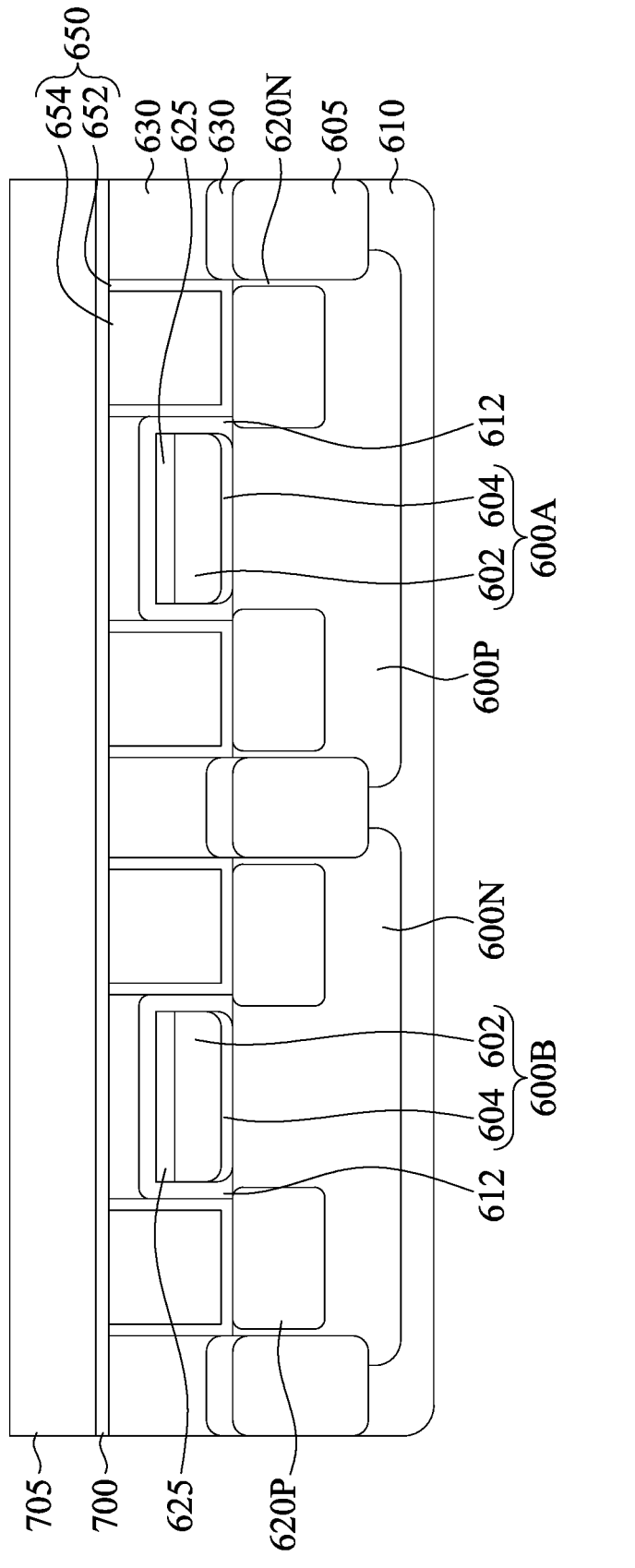
FIGS. 12A-12K illustrate a method in various stages of forming a semiconductor device in accordance with some embodiments of the present disclosure.

Reference is made to FIGS. 12A-12K. FIGS. 12A-12K illustrate a method in various stages of forming a semiconductor device in accordance with some embodiments of the present disclosure. Reference is made to FIG. 12A. An initial structure is received. The initial structure includes a substrate 610. The substrate 610 includes an N-well region 600N and a P-well region 600P, in which the N-well region 600N may be doped with N-type impurities, and the P-well region 600P may be doped with P-type impurities. The substrate 610 may be a semiconductor material and may include known structures including a graded layer or a buried oxide, for example. Other materials, such as germanium, quartz, sapphire, and glass could alternatively be used for the substrate 610. Alternatively, the silicon substrate 610 may be an active layer of a semiconductor-on-insulator (SOI) substrate or a multi-layered structure such as a silicon-germanium layer formed on a bulk silicon layer.

Isolation structures 605 are disposed in the substrate 610. In some embodiments, the isolation structures 605 may include oxide, such as silicon dioxide. The isolation structures 605, which act as a shallow trench isolation (STI) around the P-well region 600P from the N-well region 600N, may be formed by chemical vapor deposition (CVD) techniques using tetra-ethyl-ortho-silicate (TEOS) and oxygen as a precursor.

A gate structure 600A is disposed over the P-well region 600P of the substrate 610, and a gate structure 600B is disposed over the N-well region 600N of the substrate 610. In some embodiments, each of the gate structure 600A and the gate structure 600B includes a gate dielectric 602 and a gate electrode 604. In some embodiments, the gate dielectric 602 may be, for example, silicon oxide, silicon nitride, a combination thereof, or the like, and may be deposited or thermally grown according to acceptable techniques. In some embodiments, the gate electrode 604 may include polycrystalline-silicon (poly-Si) or poly-crystalline silicon-germanium (poly-SiGe). In some other embodiments, the gate structure 600A and the gate structure 600B may be metal gate structures, which include a high-k dielectric layer, a work function metal layer over the high-k dielectric layer, and a gate metal over the work function metal layer.

Capping layers 625 are disposed over the gate structures 600A and 600B. In some embodiments, the capping layers 625 may be oxide. A plurality of gate spacers 612 are disposed on opposite sides of the gate structure 600A and the gate structure 600B. In some embodiments, the gate spacers 612 may include $SiO_2$, $Si_3N_4$, $SiO_xN_y$, SiC, SiCN films, SiOC. SiOCN films, and/or combinations thereof.

Source/drain structures 620N are disposed in the P-well region 620P of the substrate 610 and on opposite sides of the gate structure 600A, and source/drain structures 620P are disposed in the N-well region 620N of the substrate 610 and on opposite sides of the gate structure 600B. In some embodiments, the source/drain structures 620N may be doped with N-type impurities, and the source/drain structures 620P may be doped with p-type impurities. In some embodiments, the source/drain structures 620N, 620P may be may be formed by performing an epitaxial growth process that provides an epitaxy material over the substrate 610, and thus the source/drain structures 620N, 620P can be interchangeably referred to as epitaxy structures 620N, 620P in this context. In various embodiments, the source/drain structures 620N, 620P may include Ge, Si, GaAs, AlGaAs, SiGe, GaAsP, SiP, or other suitable materials.

A contact etch stop layer (CESL) 630 is disposed over the isolation structures 605 and over the capping layers 625. An interlayer dielectric (ILD) layer 640 is disposed over the CESL 630 and surrounds the gate structures 600A and 600B. In some embodiments, the CESL 630 includes silicon nitride, silicon oxynitride or other suitable materials. The CESL 630 can be formed using, for example, plasma enhanced CVD, low pressure CVD, ALD or other suitable techniques. In some embodiments, the ILD layer 640 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 640 may be formed using, for example, CVD, ALD, spin-on-glass (SOG) or other suitable techniques.

Source/drain contacts 650 are disposed in the ILD layer 640 and contact the source/drain structures 620A and 620P. In some embodiments, each source/drain contact 650 includes a liner 652 and a plug 654. The liner 652 is between the plug 654 and the underlying source/drain structures 600A or 600B. In some embodiments, the liner 652 assists with the deposition of the plug 654 and helps to reduce diffusion of a material of the plug 654 through the gate spacers 612. In some embodiments, the liner 652 includes titanium (Ti), titanium nitride (TiN), tantalum (Ta), tantalum nitride (TaN), or another suitable material. The plug 654 includes a conductive material, such tungsten (W), copper (Cu), aluminum (Al), ruthenium (Ru), cobalt (Co), molybdenum (Mo), nickel (Ni), or other suitable conductive materials. In some embodiments, the plug 654 can be interchangeably referred to as a source/drain contact.

An etch stop layer (ESL) 700 is disposed over the ILD layer 640 and the source/drain contacts 650. An inter-metal dielectric (IMD) layer 705 is disposed over the ESL 700. The material and the formation method of the ESL 700 are similar to those of the CESL 630. Moreover, the material and the formation method of the IMD layer 705 are similar to those of the ILD layer 640.

Figure 12B:
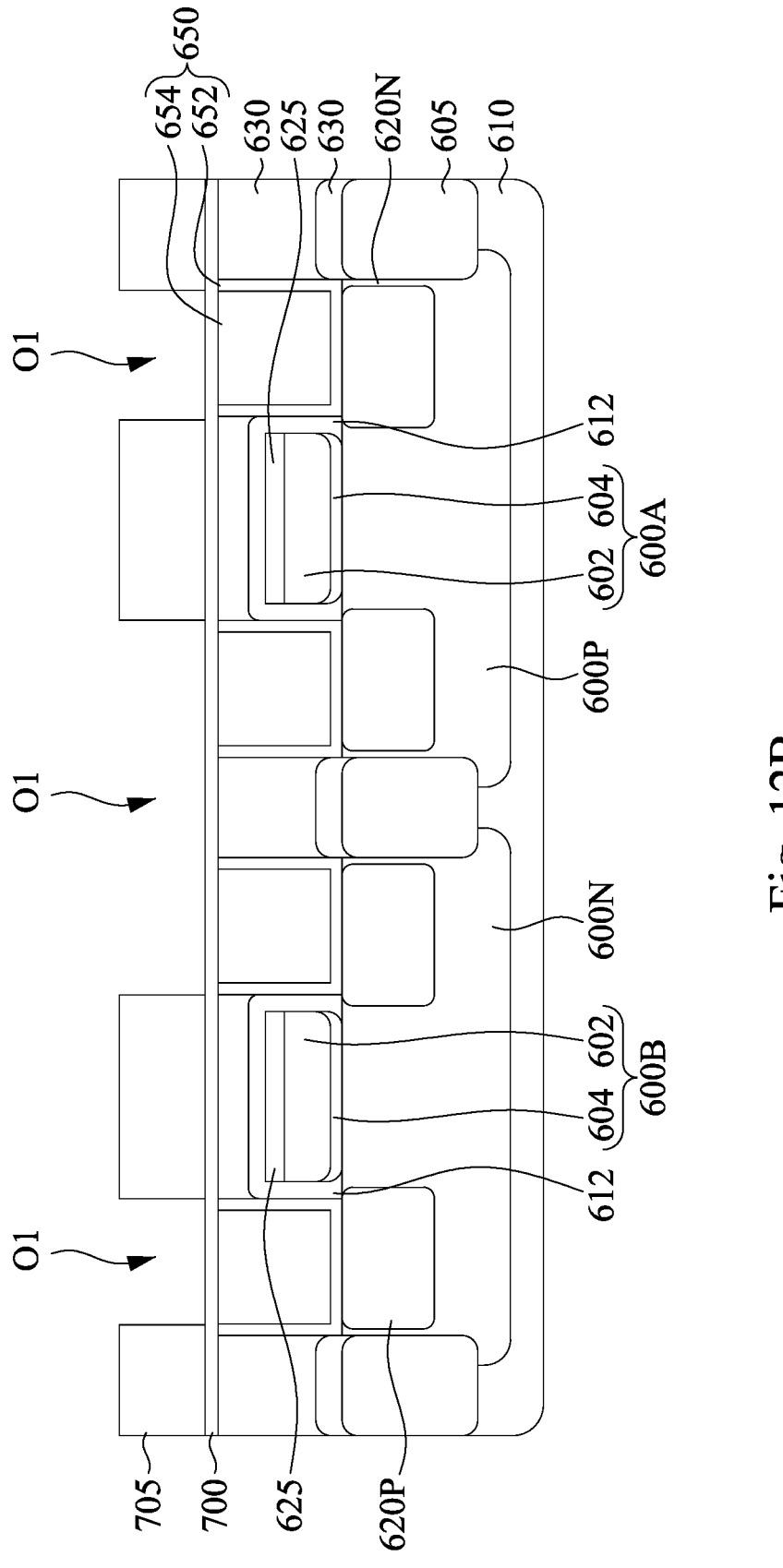
Figure 12C:
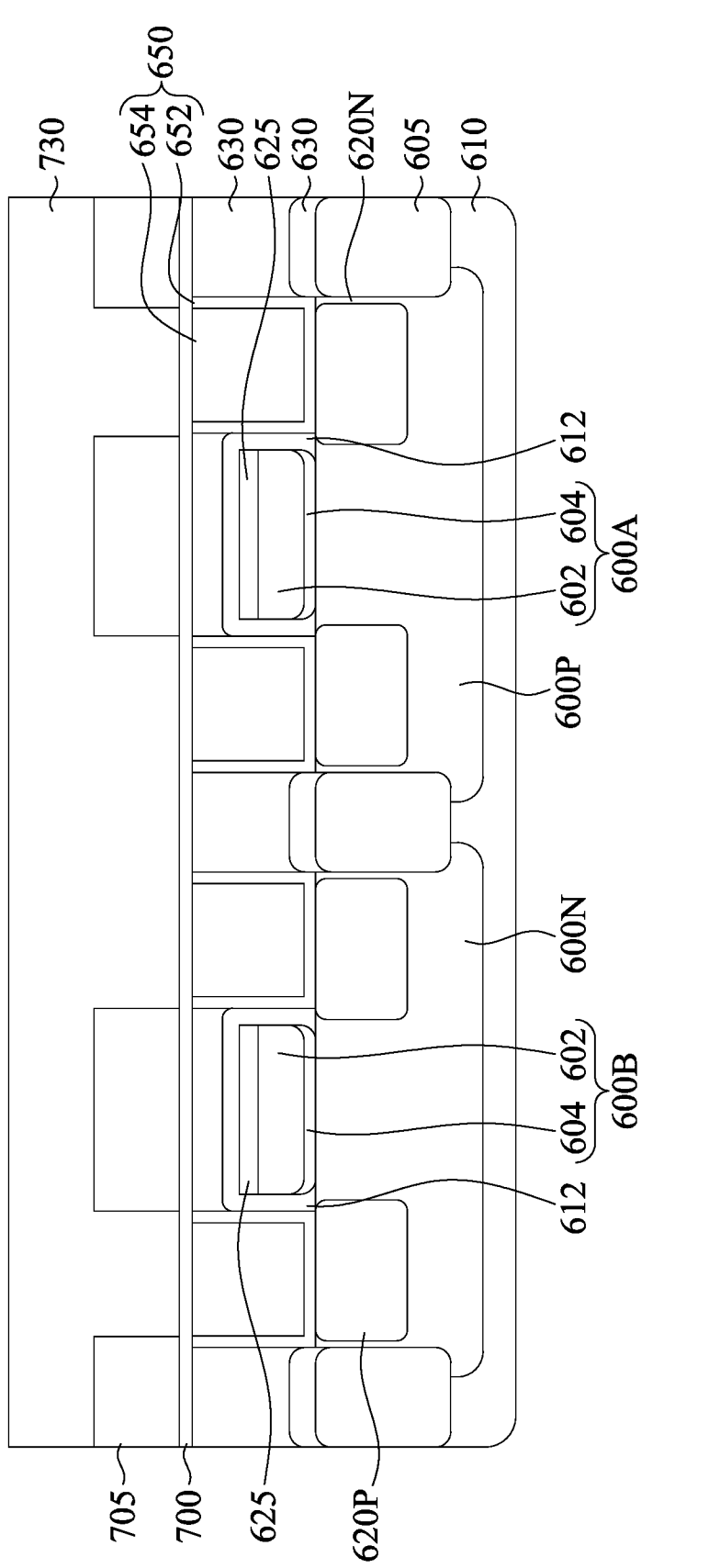

Reference is made to FIGS. 12B and 12C. The ESL 700 and the IMD layer 705 are patterned to form openings O1 (see FIG. 12B), and then a filling metal 730 is deposited over the IMD layer 705 and fills the openings O1 (see FIG. 12C). In some embodiments, the filling metal 730 is made of a conductive material. In some embodiments, the conductive material may include iron (Fe), cobalt (Co), nickel (Ni), copper (Cu), platinum (Pt), palladium (Pd), aluminum (Al), tungsten (W), ruthenium (Ru), Ti, Ta, TiN, TaN, proper alloys thereof, suitable materials, or combinations thereof. A physical property of the filling metal 730 can be described by carbon solubility (at. ppm) at a specific temperature. In some embodiments, the filling metal 730 can be made of a material having carbon solubility lower than about 35,000 at. ppm at about 1000° C. In some embodiments, the filling metal 730 can be made of a material having lower carbon solubility than the plug 654. By way of example but not limiting the present disclosure, the filling metal 730 may be made of a material, such as cobalt, having carbon solubility about 10,000 at. ppm at about 1000° C. The filling metal 730 may be made of a material, such as ruthenium, having carbon solubility about 2,300 at. ppm at about 900° C. The filling metal 730 may be made of a material, such as nickel, having carbon solubility about 9,000 at. ppm at about 900° C. The filling metal 730 may be made of a material, such as platinum, having carbon solubility about 11,000 at. ppm at about 1000° C. In some embodiments, the filling metal 730 can have higher carbon solubility than the ESL 700 and the IMD layer 705. The filling metal 730 may be made of a material, such as palladium, having carbon solubility about 33,000 at. ppm at about 1000° C. In some embodiments, the conductive material may be deposited by CVD, physical vapor deposition (PVD), sputter deposition, ALD, electroplating, or other techniques suitable for depositing conductive materials.

Figure 12D:
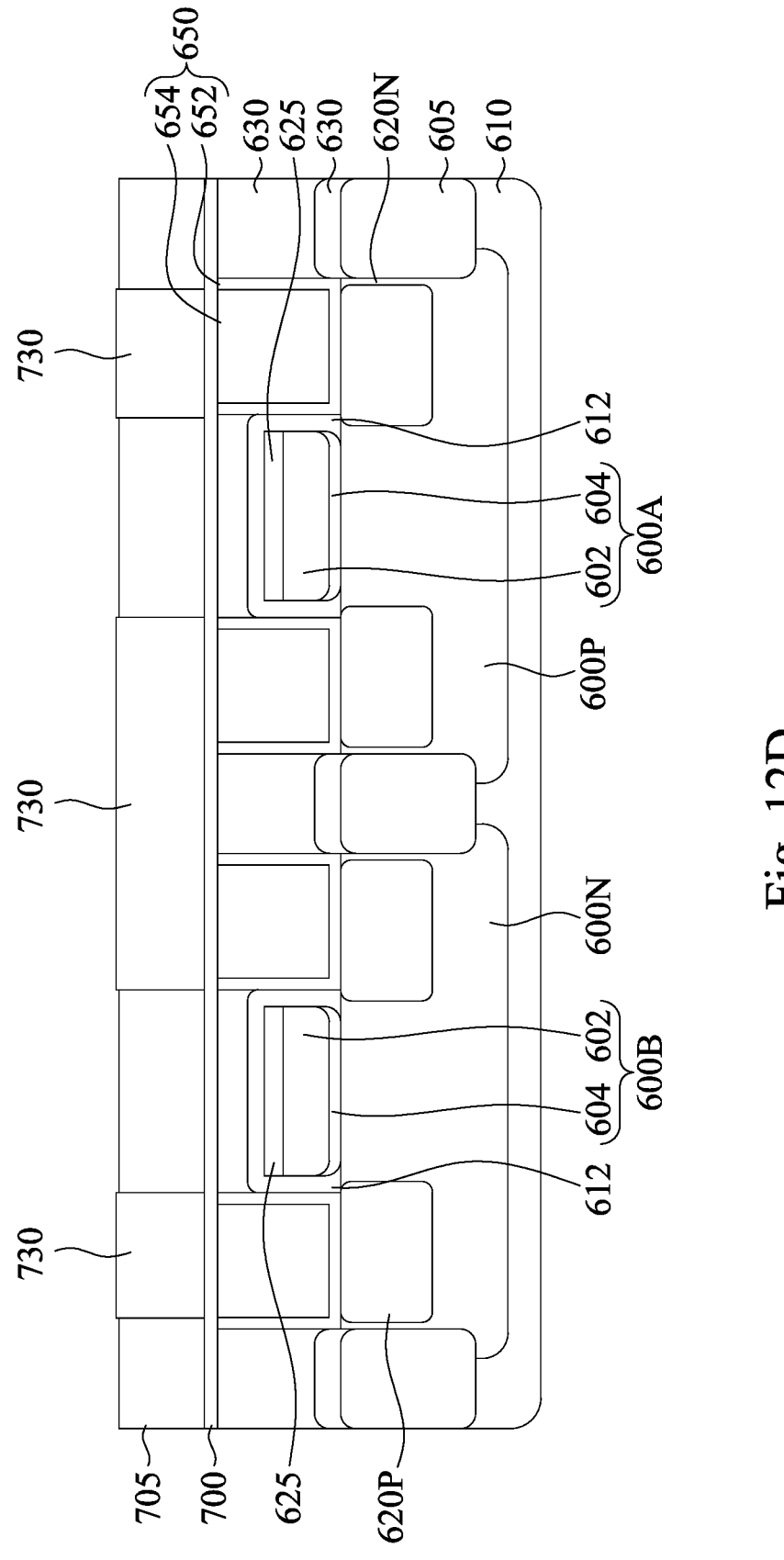

Reference is made to FIG. 12D. A chemical mechanical polishing (CMP) process is performed to remove excessive materials of the filling metal 730 until the IMD layer 705 is exposed. In some embodiments, the remaining filling metal 730 can be referred to as a metal-1 (M1) layer in a back end of line (BEOL) process. In some embodiments, the filling metal 730 can act as a catalytic layer for growing a graphene layer, which will be discussed below, and thus the filling metal 730 can be interchangeably referred to as a catalytic feature or a catalytic metal layer.

Figure 12E:
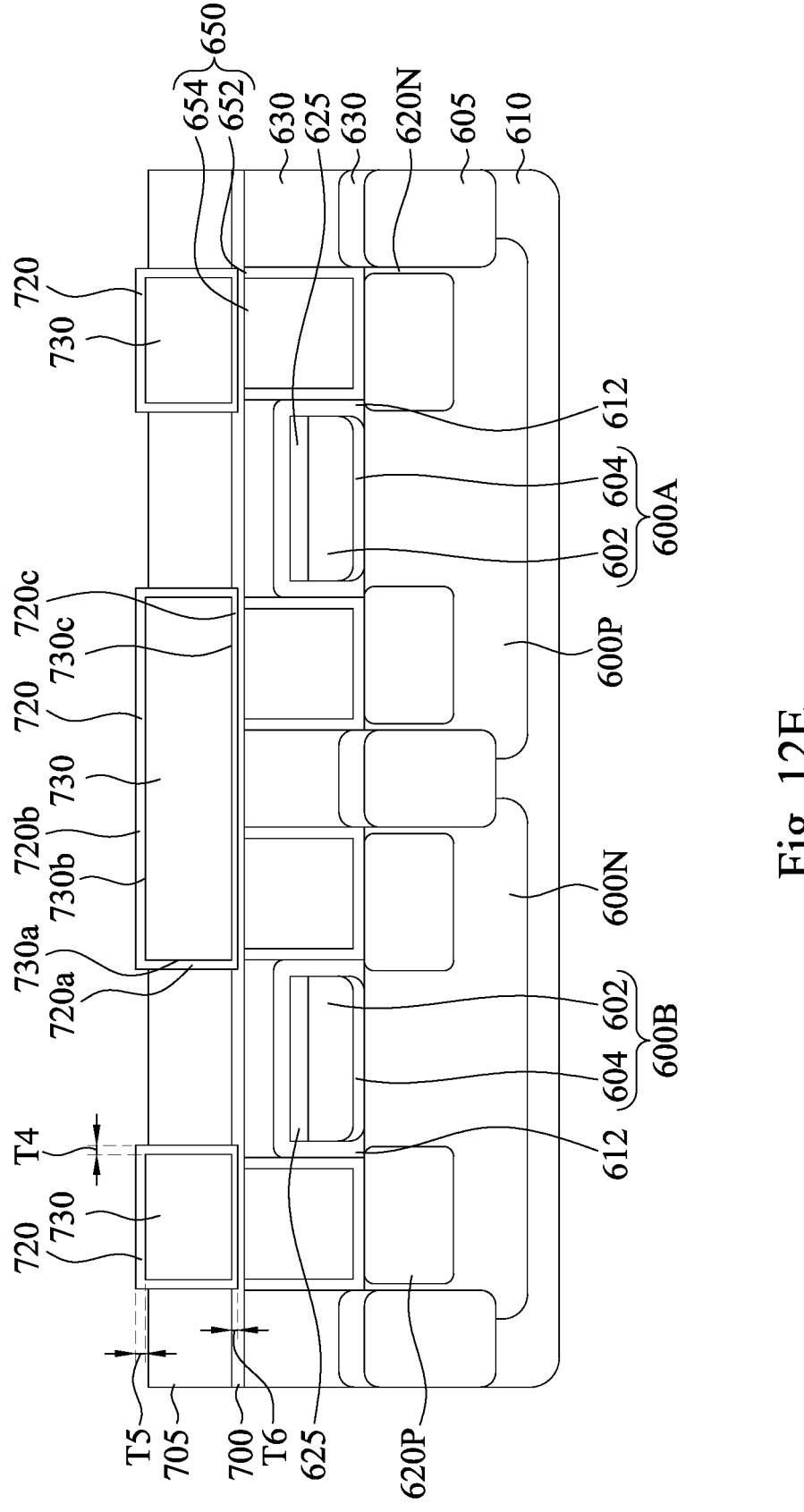

Reference is made to FIG. 12E. The HW-CVD process P3 is performed on the filling metal 730 by a deposition system 20 as shown in FIG. 8A. During the HW-CVD process P3, the filling metal 730 can be heated to a predetermined temperature, such as about 350 to 400° C., through the heater 208 as shown in FIG. 8A in an atmosphere with a carrier gas mixture including hydrogen ($H_2$) and argon (Ar). The carrier gas mixture is introduced into the processing chamber 200 (see FIG. 8A) from the sources 214 and 216 through the gas delivery line G1. In some embodiments, the hydrogen carrier gas may be performed with a flow rate in a range from between about 50 sccm to about 200 sccm, such as about 50, 75, 100, 125, 150, 175, or 200 sccm. In some embodiments, the argon carrier gas may be performed with a flow rate in a range from between about 50 sccm to about 200 sccm, such as about 50, 75, 100, 125, 150, 175, or 200 sccm.

Subsequently, a carbon precursor in a gas state is introduced into the processing chamber 200 (see FIG. 8A) under a process pressure in a range from about 0.9 to about 1.1 Torr, such as about 0.9, 1, or 1.1 Torr, from the source 212. The carbon precursor may include a carbon-containing material, such as methane, ethane, propane, ethene, propene, acetylene, other suitable material, or combinations thereof. In some embodiments, the carbon precursor may be performed with a flow rate in a range from between about 3 sccm to about 100 sccm, such as about 3, 10, 20, 30, 40, 50, 60, 70, 80, 90, or 100 sccm. The carbon precursor is pyrolyzed by the filament 206a (see FIG. 8A) of the heating belt 206. The carbon precursor is cracked to broken the carbon precursor down into carbon atoms, by the breaking of carbon-carbon bonds and/or carbon-hydrogen bonds in the carbon precursor. In some embodiments, the filament 206a is performed to heat to a temperature that the carbon precursor can be pyrolyzed, the temperature can be in a range from about 2000 to 3000° C., such as about 2000, 2100, 2200, 2277, 2300, 2400, 2500, 2527, 2600, 2700, 2800, 2900, or 3000° C.

In some embodiments, the carbon rich environment is maintained for about 5 to about 30 minutes to allow the graphene layer 720 to grow on the filling metal 730. Specifically, during the growth, the filling metal 730 serving as a catalytic feature can aid the decomposition of the pyrolyzed carbon precursor. The pyrolyzed carbon precursor can dissociate on the surface of the filling metal 730 to produce carbon atoms. Subsequently, the carbon atoms can be diffused into the bulk of the filling metal 730 and between metal grain boundaries as evidenced by the lattice expansion of the metallic substrate at a process temperature in a range from about 350 to 400° C., such as about 350, 360, 370, 380, 390, or 400° C. In some embodiments, the process temperature range can depend on the selected carbon source or inorganic source of material. For example, when methane is used, the temperature for graphene growth can be higher than when benzene is used. In some embodiments, the temperature for graphene growth can be reduced when the dissociation of the carbon source is assisted by the application of, e.g., plasma, light, or laser.

Subsequently, the filling metal 730 is cooled down. Upon cooling down, because the filling metal 730 has a low solubility for carbon at a low temperature (e.g., lower than about 350° C.) than at a higher temperature (e.g., higher than about 350° C.), these active species (i.e., carbon atoms) can be segregated to the surface of the filling metal 730, and thus a thin layer of crystalline film (i.e., graphene layer 720) is formed by precipitation. Specifically, the filling metal 730 is cooled to a temperature lower than about 350° C. such as about 350, 300, 250, 200, 150, 100, 50, or 25° C. at a cooling rate of about 20° C./min, in which the same gas condition is maintained from the beginning of graphene growth stage to the end of the cooling stage. The process conditions, such as temperature, gas pressures, and the time period for annealing and graphene growth are provided as examples. Other process conditions can also be used. Therefore, the carbon atoms aggregate and form the graphene layer 720 at the side, top, and bottom surfaces 730a, 730b, and 730c of the filling metal 730. That is, these active species can be segregated to the surface of the filling metal 730, and then a crystalline film can be formed by precipitation to form the graphene all-around filling metal 730. A physical property of the filling metal 730 can be described by carbon solubility (at. ppm) at a specific temperature. In some embodiments, the filling metal 730 can be made of a material has a carbon solubility lower than about 35,000 at. ppm at about 1000° C.

As shown in FIG. 12E, the graphene layer 720 is epitaxially formed all-around on the filling metal 730 and includes the sidewall graphene layer 720a, the top graphene layer 720b, and the bottom layer graphene 720c from the cross sectional view. In some embodiments, the graphene layer 720 may have a thickness in a range from about 0.2 nm to about 200 nm, such as about 0.2, 0.3, 0.4, 0.5, 0.6, 0.7, 0.8, 0.9, 1, 10, 20, 30, 40, 50, 60, 70, 80, 90, 100, 110, 120, 130,140, 150, 160, 170, 180, 109, or 200 nm. In some embodiments, the sidewall graphene layer 720a may be squeezed between the side surface 730a of the filling metal 730 and the IMD layer 705, and the bottom layer graphene 720c may be squeezed between the bottom surface 730c of the filling metal 730 and the ESL 700, and thus the sidewall graphene layer 720a may have a thinner thickness T4 than a thickness T5 of the top graphene layer 720b, and the bottom surface 730c may have a thinner thickness T6 than the thickness T4 of the sidewall graphene layer 720a. In some embodiments, the bottom surface 730c may have a same thickness T6 as the thickness T4 of the sidewall graphene layer. By way of example but not limiting the present disclosure, the top graphene layer 720b may have a thickness in a range from about 0.2 to about 5 nm, such as about 0.2, 0.3, 0.34, 0.5, 0.7, 0.9, 1, 1.5, 2, 2.5, 3, 3.4, 3.5, 4, 4.5, or 5 nm, the sidewall graphene layer 720a may have a thickness in a range from about 0.2 to about 3 nm, such as about 0.2, 0.3, 0.34, 0.5, 0.7, 0.9, 1, 1.02, 1.5, 2, 2.5, or 3 nm, and the bottom graphene layer 720c may have a thickness in a range from about 0.2 to about 3 nm, such as about 0.2, 0.3, 0.34, 0.5, 0.7, 0.9, 1, 1.02, 1.5, 2, 2.5, or 3 nm.

Figure 12F:
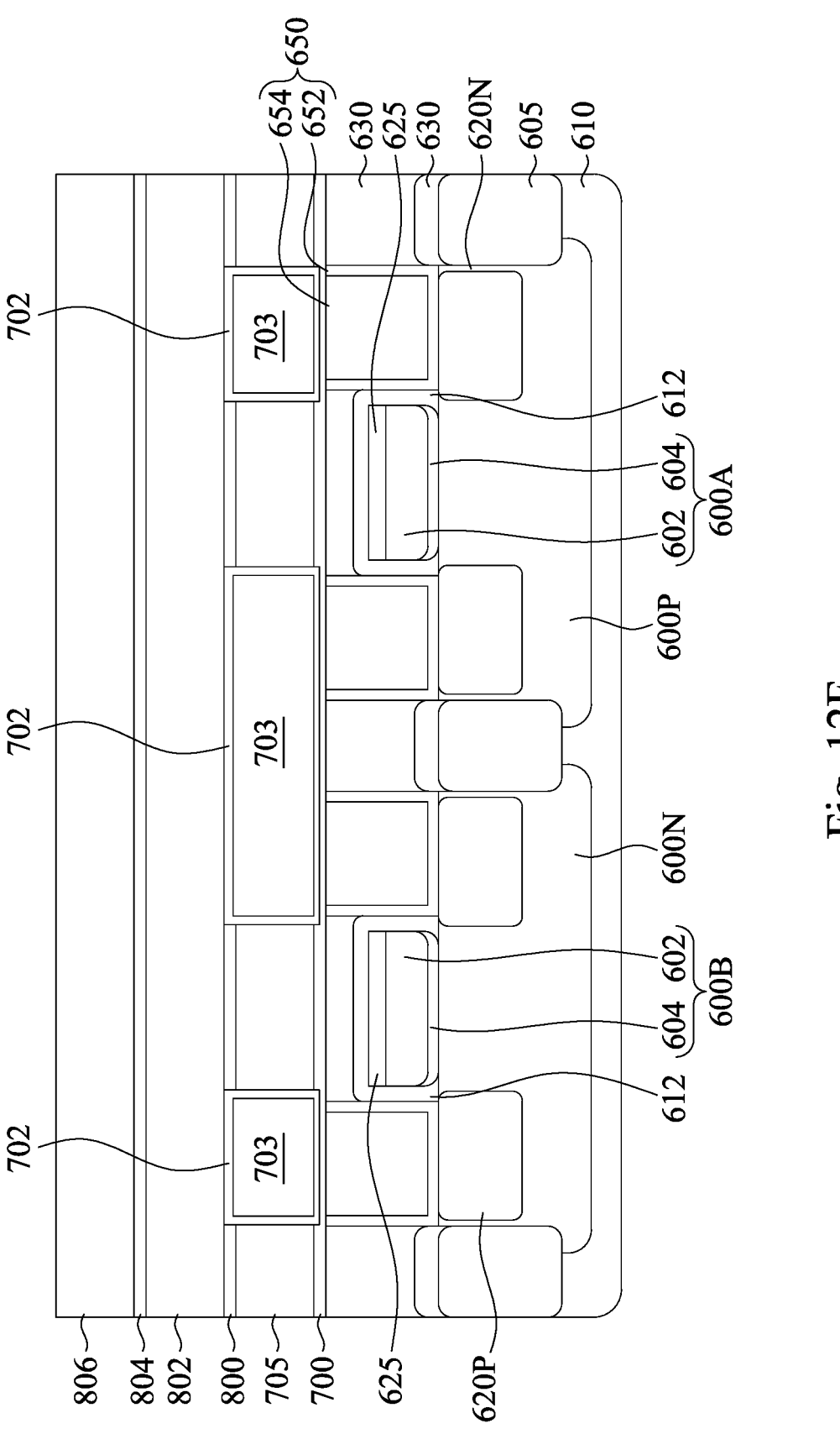

Reference is made to FIG. 12F. An ESL 800, an IMD layer 802, an ESL 804, and an IMD layer 806 are formed sequentially over the IMD layer 705. The ESLs 800 and 804 are similar to the ESL 700, the IMD layers 802 and 806 are similar to the IMD layer 705, and thus relevant details will not be repeated for brevity. This is described in greater detail with reference to FIG. 12F, the ESL 800 may have non-uniform thickness due to the underlying graphene layers 720. That is, the ESL 800 on the graphene layers 720 may have a thinner thickness than that on the IMD layer 705. In some embodiments, the ESL 800 has uniform thickness, but the IMD layer 802 has non-uniform thickness due to the ESL 800 being conformal over the graphene layers 720.

Figure 12G:
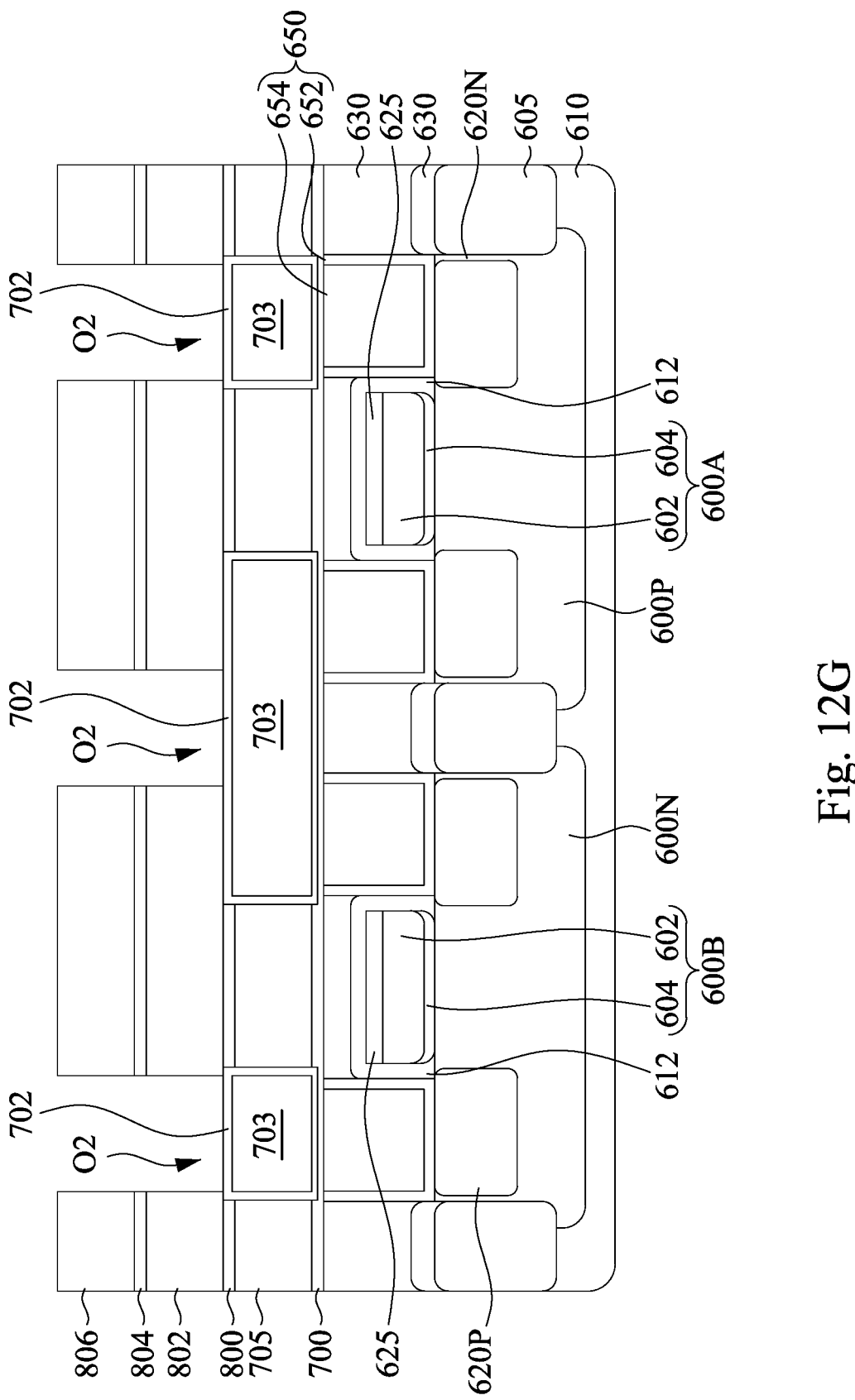

Reference is made to FIG. 12G. The ESL 800, the IMD layer 802, the ESL 804, and the IMD layer 806 are patterned to form via openings O2. In some embodiments, the via openings O2 are aligned with and expose the graphene layers 740. In some embodiments, via openings O2 may be formed by, for example, forming a patterned photoresist layer over the IMD layer 806, followed by an etching process to remove portions of the ESL 800, the IMD layer 802, the ESL 804, and the IMD layer 806, and then removing the photoresist layer.

Figure 12H:
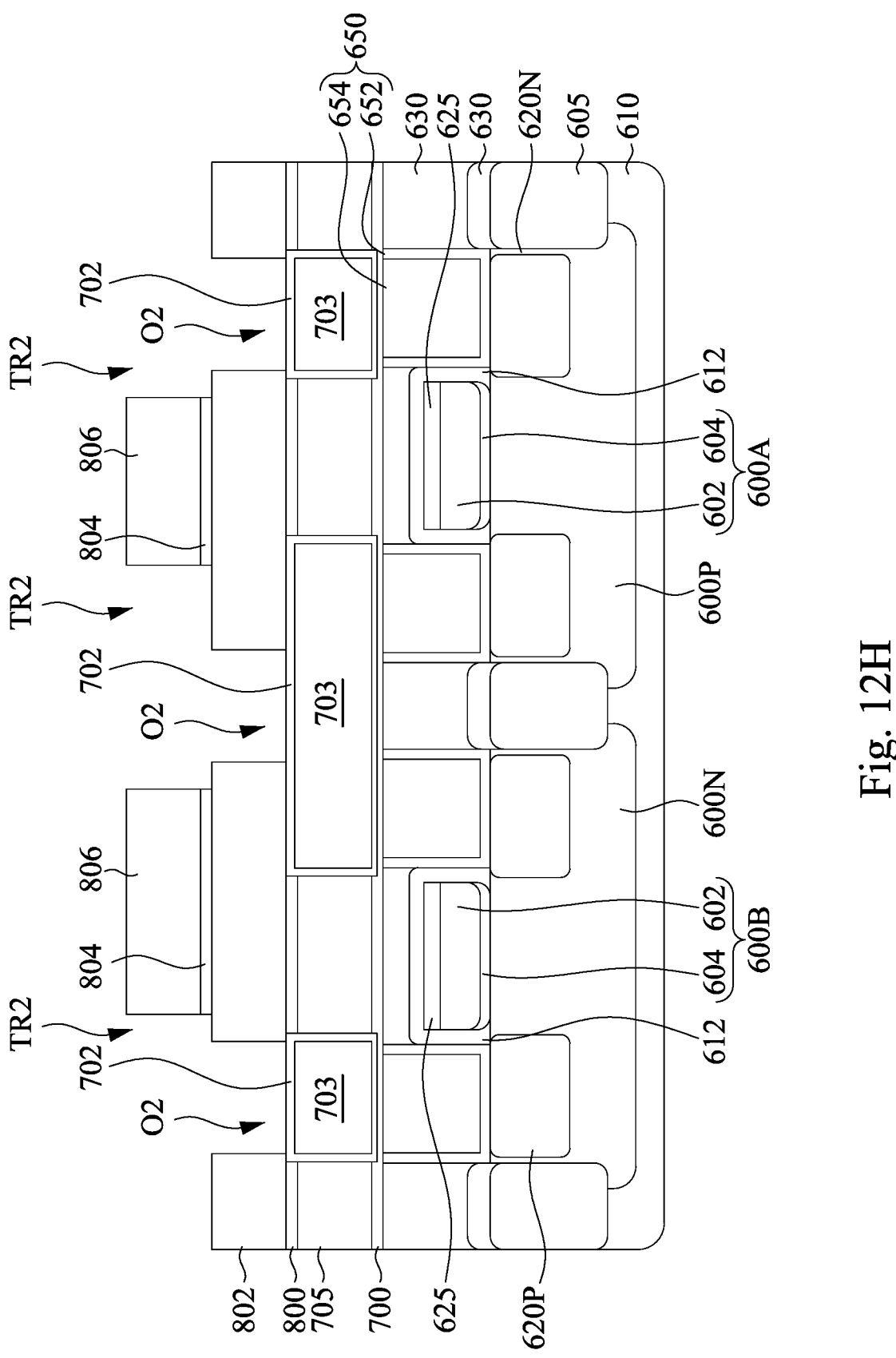

Reference is made to FIG. 12H. The ESL 804 and the IMD layer 806 are patterned to form trenches TR2 that are aligned above the via openings O2. In some embodiments, the trenches TR2 may be formed by, for example, forming a patterned photoresist layer over the IMD layer 806, followed by an etching process to remove portions of the ESL 804, and the IMD layer 806, and then removing the photoresist layer.

Figure 12I:
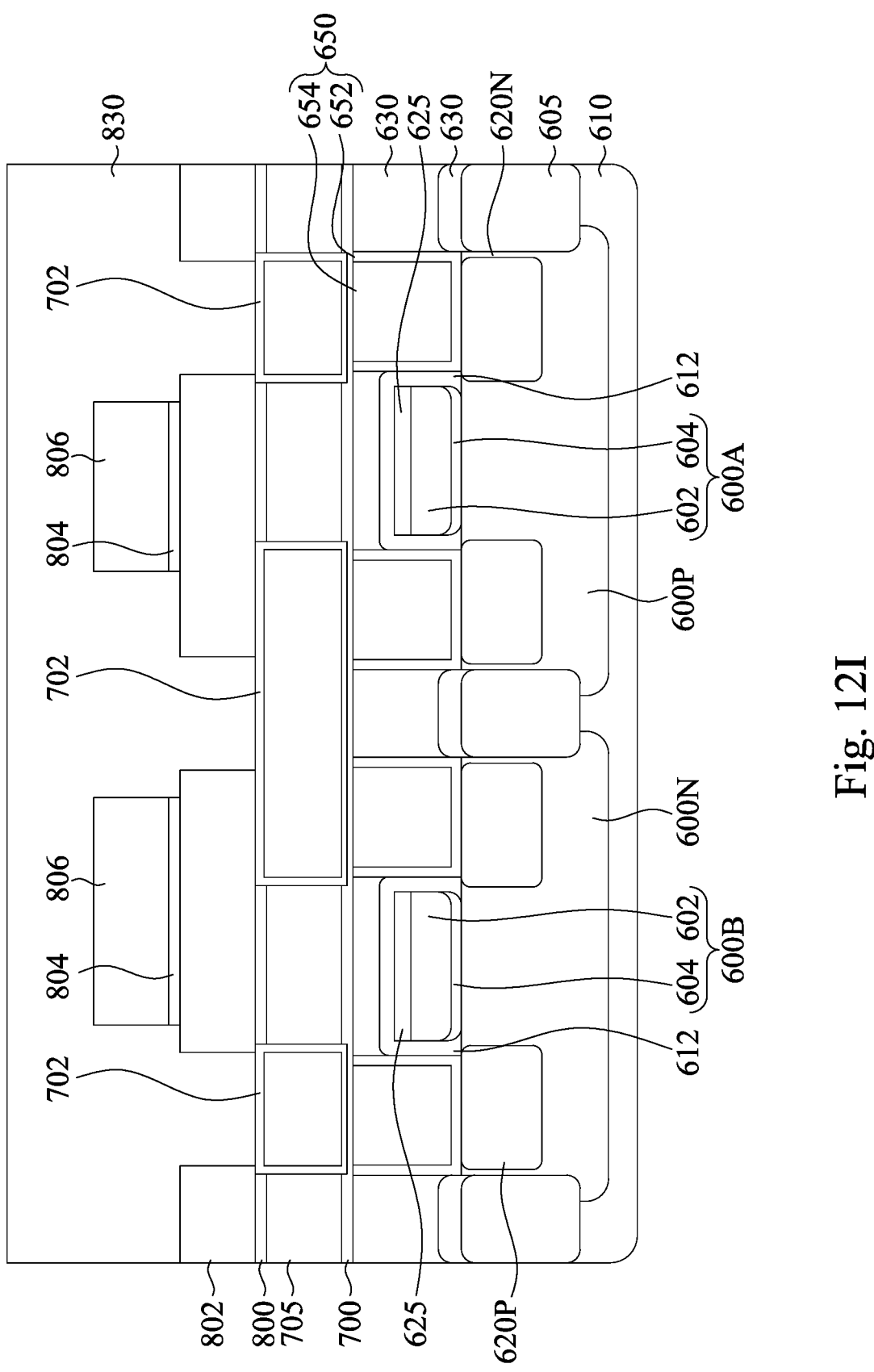

Reference is made to FIG. 12I. A filling metal 830 is deposited over the IMD layer 806 and fills the via openings O2 and the trenches TR2. The filling metal 830 is similar to the filling metal 730, and thus relevant details will not be repeated hereinafter. In some embodiments, the filling metal 830 can act as a catalytic layer for growing a graphene layer, which will be discussed below, and thus the filling metal 830 can be interchangeably referred to as a catalytic feature or a catalytic metal layer. In some embodiments, the filling metal 830 can have higher carbon solubility than the ESL 800, the IMD layer 802, the ESL 804, and the IMD layer 806.

Figure 12J:
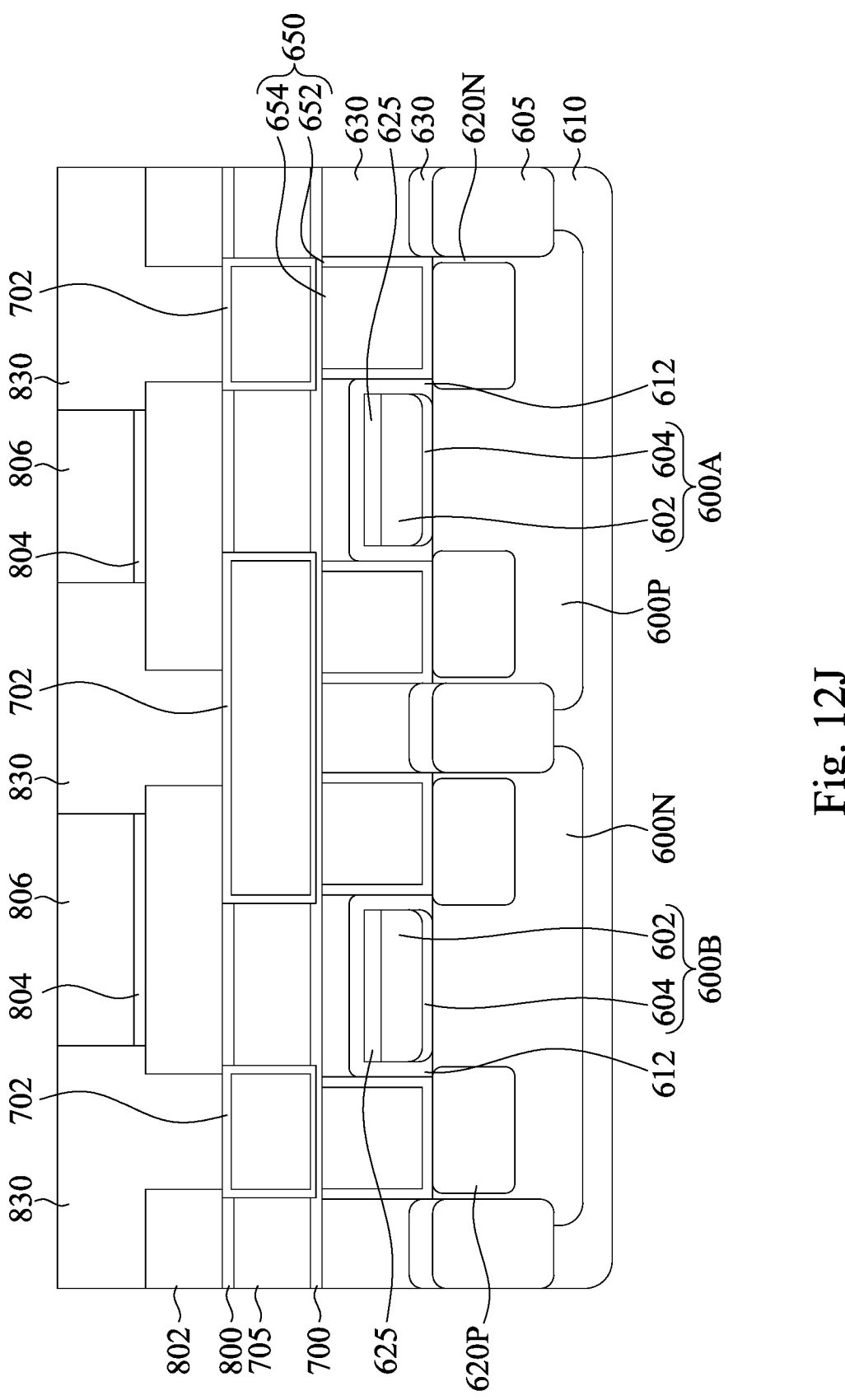

Reference is made to FIG. 12J. A chemical mechanical polishing (CMP) process is performed to remove excessive materials of the filling metal 830 until the IMD layer 806 is exposed. In some embodiments, the remaining filling metal 830, the graphene layer 820, the magnetic layer 815, and the liner 810 can be referred to as a metal-2 (M2) layer in a back end of line (BEOL) process.

Figure 12K:
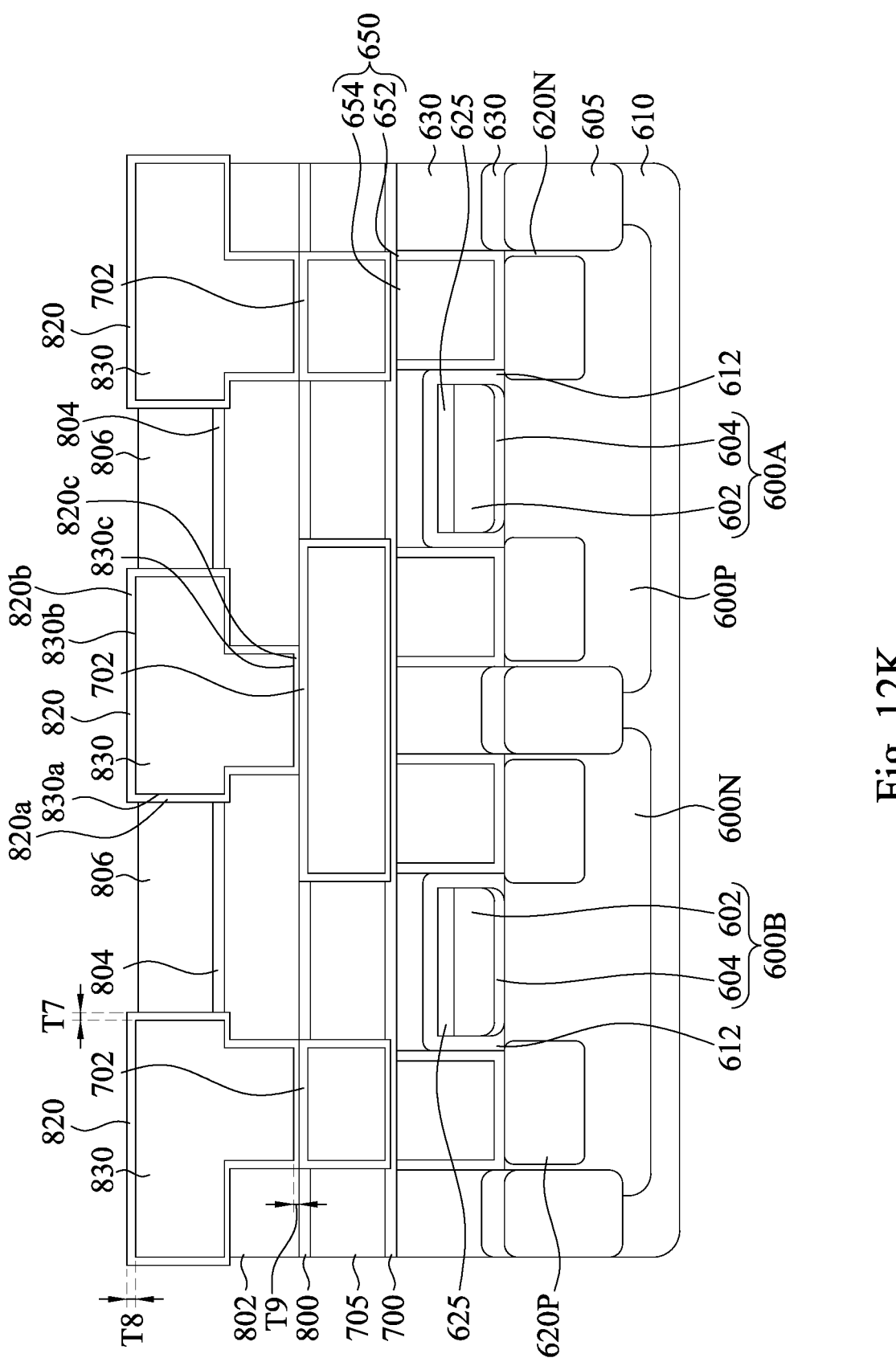

Reference is made to FIG. 12K. The HW-CVD process P3 is performed on the filling metal 830 by a deposition system 20 as shown in FIG. 8A. During the HW-CVD process P3, the filling metal 830 can be heated to a predetermined temperature, such as about 350 to 400° C., through the heater 208 as shown in FIG. 8A in an atmosphere with a carrier gas mixture including hydrogen ($H_2$) and argon (Ar). The carrier gas mixture is introduced into the processing chamber 200 (see FIG. 8A) from the sources 214 and 216 through the gas delivery line G1. In some embodiments, the hydrogen carrier gas may be performed with a flow rate in a range from between about 50 sccm to about 200 sccm, such as about 50, 75, 100, 125, 150, 175, or 200 sccm. In some embodiments, the argon carrier gas may be performed with a flow rate in a range from between about 50 sccm to about 200 sccm, such as about 50, 75, 100, 125, 150, 175, or 200 sccm.

Subsequently, a carbon precursor in a gas state is introduced into the processing chamber 200 (see FIG. 8A) under a process pressure in a range from about 0.9 to about 1.1 Torr, such as about 0.9, 1, or 1.1 Torr, from the source 212. The carbon precursor may include a carbon-containing material, such as methane, ethane, propane, ethene, propene, acetylene, other suitable material, or combinations thereof. In some embodiments, the carbon precursor may be performed with a flow rate in a range from between about 3 sccm to about 100 sccm, such as about 3, 10, 20, 30, 40, 50, 60, 70, 80, 90, or 100 sccm. The carbon precursor is pyrolyzed by the filament 206a (see FIG. 8A) of the heating belt 206. The carbon precursor is cracked to broken the carbon precursor down into carbon atoms, by the breaking of carbon-carbon bonds and/or carbon-hydrogen bonds in the carbon precursor. In some embodiments, the filament 206a is performed to heat to a temperature that the carbon precursor can be pyrolyzed, the temperature can be in a range from about 2000 to 3000° C., such as about 2000, 2100, 2200, 2277, 2300, 2400, 2500, 2527, 2600, 2700, 2800, 2900, or 3000° C.

In some embodiments, the carbon rich environment is maintained for about 5 to about 30 minutes to allow the graphene layer 820 to grow on the filling metal 830. Specifically, during the growth, the filling metal 830 serving as a catalytic feature can aid the decomposition of the pyrolyzed carbon precursor. The pyrolyzed carbon precursor can dissociate on the surface of the filling metal 830 to produce carbon atoms. Subsequently, the carbon atoms can be diffused into the bulk of the filling metal 830 and between metal grain boundaries as evidenced by the lattice expansion of the metallic substrate at a process temperature in a range from about 350 to 400° C., such as about 350, 360, 370, 380, 390, or 400° C. In some embodiments, the process temperature range can depend on the selected carbon source or inorganic source of material. For example, when methane is used, the temperature for graphene growth can be higher than when benzene is used. In some embodiments, the temperature for graphene growth can be reduced when the dissociation of the carbon source is assisted by the application of, e.g., plasma, light, or laser.

Subsequently, the filling metal 830 is cooled down. Upon cooling down, because the filling metal 830 has a low solubility for carbon at a low temperature (e.g., lower than about 350° C.) than at a higher temperature (e.g., higher than about 350° C.), these active species (i.e., carbon atoms) can be segregated to the surface of the filling metal 830, and thus a thin layer of crystalline film (i.e., graphene layer 820) is formed by precipitation. Specifically, the filling metal 830 is cooled to a temperature lower than about 350° C., such as about 350, 300, 250, 200, 150, 100, 50, or 25° C., at a cooling rate of about 20° C./min, in which the same gas condition is maintained from the beginning of graphene growth stage to the end of the cooling stage. The process conditions, such as temperature, gas pressures, and the time period for annealing and graphene growth are provided as examples. Other process conditions can also be used. Therefore, the carbon atoms aggregate and form the graphene layer 820 at the side, top, and bottom surfaces 830*a*, 830*b*, and 830*c* of the filling metal 830. That is, these active species can be segregated to the surface of the filling metal 830, and then a crystalline film can be formed by precipitation to form the graphene all-around filling metal 830. A physical property of the filling metal 830 can be described by carbon solubility (at. ppm) at a specific temperature. In some embodiments, the filling metal 830 can be made of a material has a carbon solubility lower than about 35,000 at. ppm at about 1000° C.

As shown in FIG. 12K, the graphene layer 820 is epitaxially formed all-around on the filling metal 830 and includes the sidewall graphene layer 820*a*, the top graphene layer 820*b*, and the bottom layer graphene 820*c* from the cross sectional view. In some embodiments, the graphene layer 820 may have a thickness in a range from about 0.2 nm to about 200 nm, such as about 0.2, 0.3, 0.4, 0.5, 0.6, 0.7, 0.8, 0.9, 1, 10, 20, 30, 40, 50, 60, 70, 80, 90, 100, 110, 120, 130, 140, 150, 160, 170, 180, 109, or 200 nm. In some embodiments, the sidewall graphene layer 820*a* may be squeezed between the side surface 830*a* of the filling metal 830 and the IMD layer 802, the ESL 804, and the IMD layer 806, and the bottom layer graphene 820*c* may be squeezed between the bottom surface 830*c* of the filling metal 830 and the graphene layer 720, and thus the sidewall graphene layer 820*a* may have a thinner thickness T7 than a thickness T8 of the top graphene layer 820*b*, and the bottom surface 830*c* may have a thinner thickness T9 than the thickness T7 of the sidewall graphene layer 820*a*. In some embodiments, the bottom surface 830*c* may have a same thickness T9 as the thickness T7 of the sidewall graphene layer. By way of example but not limiting the present disclosure, the top graphene layer 820*b* may have a thickness in a range from about 0.2 to about 5 nm, such as about 0.2, 0.3, 0.34, 0.5, 0.7, 0.9, 1, 1.5, 2, 2.5, 3, 3.4, 3.5, 4, 4.5, or 5 nm, the sidewall graphene layer 820*a* may have a thickness in a range from about 0.2 to about 3 nm, such as about 0.2, 0.3, 0.34, 0.5, 0.7, 0.9, 1, 1.02, 1.5, 2, 2.5, or 3 nm, and the bottom graphene layer 820*c* may have a thickness in a range from about 0.2 to about 3 nm, such as about 0.2, 0.3, 0.34, 0.5, 0.7, 0.9, 1, 1.02, 1.5, 2, 2.5, or 3 nm. In some embodiments, the line width of the metal-2 layer is greater than the line width of the metal-1 layer, and so the graphene layers 820 of the metal-2 layer can be formed thicker than the graphene layer 720 of the metal-1 layer.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a hot wire-chemical vapor deposition (HW-CVD) process performed at a low-temperature (e.g. lower than about 400° C.) with a pyrolyzation on a carbon precursor in advance and without an additional transferring process after the formation of the graphene layer. Specifically, during the CVD process, a carbon precursor is pyrolyzed with a hot wire in a process chamber, and then introduced to the catalytic metal interconnect (e.g., cobalt, ruthenium). The pyrolyzed carbon precursor can be decomposed on the catalytic metal interconnect at a temperature lower than about 400° C. Subsequently, the decomposed species were diffused into the bulk of the metal interconnect. Subsequently, upon cooling down, these active species can be segregated to the surface of the metal interconnect, and then a crystalline film can be formed by precipitation to form a graphene all-around interconnect. Because the decomposition, the diffusion, and the segregation of the carbon precursor can be performed at a temperature under 400° C., a lower thermal budget to synthesize the graphene layer on the metal interconnect is reached, such that the performance of the IC structure can be improved. For example, the graphene layer can be formed on the MLI of the IC structure in the BEOL process with a temperature under 400° C. and without damaging the elements in the IC structure, which in turn increases the reliability of the IC structure. In addition, the graphene layer is formed all-around on the metal interconnect, which in turn increases breakdown current and prolongs the electromigration lifetime of the IC structure. Furthermore, because the graphene layer can be epitaxially grown on the catalytic metal interconnect directly, there is no need to perform an additional transferring process on the graphene layer, and thus fabrication of the IC structure will not result in additional processes that may damage the IC structure and hence additional cost.

In some embodiments, a method includes loading a wafer having a catalytic metal thereon into a processing chamber; introducing a hydrocarbon precursor into the processing chamber; pyrolyzing the hydrocarbon precursor; conducting the pyrolyzed hydrocarbon precursor to the catalytic metal to form a graphene layer on the catalytic metal at a temperature lower than about 400° C. In some embodiments, pyrolyzing the hydrocarbon precursor is performing at a temperature in a range from about 2000° C. to about 3000° C. In some embodiments, pyrolyzing the hydrocarbon precursor is performed by a filament. In some embodiments, the filament is made of a tantalum-containing material. In some embodiments, pyrolyzing the hydrocarbon precursor includes: providing a current in a range from about 4 A to about 6 A to the filament. In some embodiments, conducting the pyrolyzed hydrocarbon precursor to the catalytic metal to form the graphene layer includes: heating the catalytic metal to a temperature greater than about 350° C. to decompose the pyrolyzed hydrocarbon precursor on the catalytic metal and further diffuse the decomposed hydrocarbon precursor into the catalytic metal. In some embodiments, the method further includes: after heating the catalytic metal, cooling the catalytic metal to a temperature lower than about 350° C. to segregate the decomposed hydrocarbon precursor from an interior of the catalytic metal to an all-around surface of the catalytic metal. In some embodiments, heating the catalytic metal is performed by a furnace around the processing chamber. In some embodiments, the catalytic metal has carbon solubility lower than 35,000 at. ppm at a melting point of the catalytic metal. In some embodiments, the catalytic metal includes cobalt, ruthenium, nickel, platinum, palladium, or combinations thereof.

In some embodiments, a method includes forming a transistor on a substrate; forming a source/drain contact on a source/drain region of the transistor; forming a dielectric layer over the source/drain contact; etching the dielectric layer to form an opening exposing the source/drain contact; depositing a filling metal in the opening of the dielectric layer; after forming the filling metal, growing a graphene layer wrapping around the filling metal. In some embodiments, growing the graphene layer includes introducing carbon atoms to the filling metal at a temperature in a range from about 350° C. to about 400° C. In some embodiments, growing the graphene layer further includes after introducing carbon atoms, cooling the filling metal to a temperature lower than about 350° C. In some embodiments, growing the graphene layer is performed under a pressure in a range from about 0.9 Torr to about 1.1 Torr. In some embodiments, the filling metal has higher carbon solubility than the dielectric layer.

In some embodiments, the semiconductor structure includes a semiconductor substrate, a gate structure, source/drain structures, a contact, a dielectric layer, a metal line, and a graphene layer. The gate structure is on the semiconductor substrate. The source/drain structures are on opposite sides of the gate structure. The contact lands on one of the source/drain structures. The dielectric layer spans the contact and the gate structure. The metal line extends through the dielectric layer to the contact. The graphene layer is on a top surface, a sidewall, and a bottom surface of the metal line. In some embodiments, the graphene layer on the top surface of the metal line has a thicker thickness than the graphene layer on the sidewall of the metal line. In some embodiments, the graphene layer on the top surface of the metal line has a thickness in a range from about 0.34 to about 3.4 nm. In some embodiments, the graphene layer on the sidewall of the metal line has a thickness in a range from about 0.34 to about 1.02 nm. In some embodiments, the graphene layer on the top surface of the metal line has a thicker thickness than the graphene layer on the bottom surface of the metal line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
loading a wafer having a catalytic metal thereon into a processing chamber;
introducing a hydrocarbon precursor into the processing chamber;
pyrolyzing the hydrocarbon precursor; and
conducting the pyrolyzed hydrocarbon precursor to the catalytic metal to form a graphene layer on the catalytic metal at a temperature lower than about 400° C.

2. The method of claim 1, wherein pyrolyzing the hydrocarbon precursor is performing at a temperature in a range from about 2000° C. to about 3000° C.

3. The method of claim 1, wherein pyrolyzing the hydrocarbon precursor is performed by a filament.

4. The method of claim 3, wherein the filament is made of a tantalum-containing material.

5. The method of claim 3, wherein pyrolyzing the hydrocarbon precursor comprises:
providing a current in a range from about 4 A to about 6 A to the filament.

6. The method of claim 1, wherein conducting the pyrolyzed hydrocarbon precursor to the catalytic metal to form the graphene layer comprises:
heating the catalytic metal to a temperature greater than about 350° C. to decompose the pyrolyzed hydrocarbon precursor on the catalytic metal and further diffuse the decomposed hydrocarbon precursor into the catalytic metal.

7. The method of claim 6, further comprising:
after heating the catalytic metal, cooling the catalytic metal to a temperature lower than about 350° C. to segregate the decomposed hydrocarbon precursor from an interior of the catalytic metal to an all-around surface of the catalytic metal.

8. The method of claim 6, wherein heating the catalytic metal is performed by a furnace around the processing chamber.

9. The method of claim 1, wherein the catalytic metal has carbon solubility lower than 35,000 at. ppm at a melting point of the catalytic metal.

10. The method of claim 1, wherein the catalytic metal comprises cobalt, ruthenium, nickel, platinum, palladium, or combinations thereof.

11. A method, comprising:
forming a transistor on a substrate;
forming a source/drain contact on a source/drain region of the transistor;
forming a dielectric layer over the source/drain contact;
etching the dielectric layer to form an opening exposing the source/drain contact;
depositing a filling metal in the opening of the dielectric layer; and
after forming the filling metal, growing a graphene layer wrapping around the filling metal, wherein the step of growing the graphene layer comprises introducing carbon atoms to the filling metal at a temperature in a range from about 350° C. to about 400° C.

12. The method of claim 11, wherein growing the graphene layer further comprises:
after introducing the carbon atoms, cooling the filling metal to a temperature lower than about 350° C.

13. The method of claim 11, wherein growing the graphene layer is performed under a pressure in a range from about 0.9 Torr to about 1.1 Torr.

14. The method of claim 11, wherein the filling metal has higher carbon solubility than the dielectric layer.

15. A semiconductor structure, comprising:
a semiconductor substrate;
a gate structure on the semiconductor substrate;
source/drain structures on opposite sides of the gate structure;
a contact landing on one of the source/drain structures;
a dielectric layer spanning the contact and the gate structure;
a filling metal extending through the dielectric layer to the contact, wherein the filling metal has a higher carbon solubility than the dielectric layer; and
a graphene layer on a top surface, a sidewall, and a bottom surface of the filling metal.

16. The semiconductor structure of claim 15, wherein the graphene layer on the top surface of the filling metal has a thicker thickness than the graphene layer on the sidewall of the filling metal.

17. The semiconductor structure of claim 15, wherein the graphene layer on the top surface of the filling metal has a thickness in a range from about 0.34 to about 3.4 nm.

18. The semiconductor structure of claim 15, wherein the graphene layer on the sidewall of the filling metal has a thickness in a range from about 0.34 to about 1.02 nm.

19. The semiconductor structure of claim 15, wherein the graphene layer on the top surface of the filling metal has a thicker thickness than the graphene layer on the bottom surface of the filling metal.

20. The semiconductor structure of claim 15, wherein the filling metal has the carbon solubility lower than 35,000 at. ppm at a melting point of the filling metal.

\*  \*  \*  \*  \*